(12) United States Patent
Kwon

(10) Patent No.: US 11,355,186 B2
(45) Date of Patent: Jun. 7, 2022

(54) MEMORY DEVICE

(71) Applicant: Samsung Electronics Co., Ltd., Suwon-si (KR)

(72) Inventor: Yongjin Kwon, Suwon-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 44 days.

(21) Appl. No.: 16/859,191

(22) Filed: Apr. 27, 2020

(65) Prior Publication Data

US 2021/0098062 A1   Apr. 1, 2021

(30) Foreign Application Priority Data

Oct. 1, 2019   (KR) .................. 10-2019-0121568

(51) Int. Cl.
  *G11C 11/00*   (2006.01)
  *G11C 13/00*   (2006.01)
  *G11C 5/02*    (2006.01)

(52) U.S. Cl.
  CPC .......... *G11C 13/0026* (2013.01); *G11C 5/025* (2013.01); *G11C 13/0028* (2013.01)

(58) Field of Classification Search
  CPC ..... G11C 11/00; G11C 13/0026; G11C 5/025; G11C 13/0028
  USPC ........................................................ 365/148
  See application file for complete search history.

(56) References Cited

U.S. PATENT DOCUMENTS

| | | | | |
|---|---|---|---|---|
| 8,467,228 B2* | 6/2013 | Ikeda | .................... | H01L 27/101 365/148 |
| 8,467,229 B2* | 6/2013 | Ikeda | ................. | G11C 13/0007 365/148 |
| 8,890,228 B2 | 11/2014 | Lee et al. | | |
| 8,982,603 B2* | 3/2015 | Azuma | ................ | G11C 13/004 365/148 |
| 9,514,807 B2 | 12/2016 | Kang et al. | | |
| 2011/0305068 A1 | 12/2011 | Kitagawa et al. | | |
| 2013/0077384 A1* | 3/2013 | Azuma | .................... | G11C 8/08 365/148 |
| 2013/0200331 A1 | 8/2013 | Morikawa et al. | | |
| 2014/0321193 A1 | 10/2014 | Park | | |
| 2017/0250190 A1 | 8/2017 | Tanzawa et al. | | |
| 2019/0116668 A1 | 4/2019 | Lizalde Moreno et al. | | |
| 2019/0139968 A1 | 5/2019 | Shim et al. | | |
| 2019/0140022 A1 | 5/2019 | Jeong et al. | | |
| 2019/0164991 A1 | 5/2019 | Lim et al. | | |

* cited by examiner

*Primary Examiner* — Harry W Byrne

(74) *Attorney, Agent, or Firm* — Harness, Dickey & Pierce, P.L.C.

(57) ABSTRACT

A memory device includes a plurality of bit lines extending in a first direction, a plurality of lower memory cells below the bit lines and connected to the plurality of bit lines, and a plurality of upper memory cells above the plurality of bit lines and connected to the plurality of bit lines. The memory device comprises a plurality of cell array regions and a plurality of bit line contact regions alternately stacked in the first direction, the plurality of upper memory cells and the plurality of lower memory cells are located in the cell array regions, and only one of either the plurality of upper memory cells or the plurality of lower memory cells are arranged in at least one of the bit line contact regions.

20 Claims, 26 Drawing Sheets

MEMORY DEVICE

CROSS-REFERENCE TO RELATED APPLICATION(S)

This U.S. non-provisional application claims the benefit of priority under 35 USC 119(a) to Korean Patent Application No. 10-2019-0121568, filed on Oct. 1, 2019 in the Korean Intellectual Property Office, the entire disclosure of which is incorporated herein by reference for all purposes.

BACKGROUND

Various example embodiments of the present inventive concepts relate to memory devices.

Memory devices may provide functions of recording (e.g., writing), erasing data, and/or reading recorded data. Recently, research into memory devices that write or erase data using resistance changes has been actively conducted. Memory devices using a resistor include a phase change random access memory (PRAM), a resistive memory (Re-RAM), a magnetic memory device (MRAM), and the like.

SUMMARY

An aspect of at least one example embodiment of the present inventive concepts provides a memory device including memory cells above an area in which bit lines and a circuit area are connected.

In at least one example embodiment, a memory device includes a plurality of bit lines extending in a first direction, a plurality of lower memory cells below the plurality of bit lines, the plurality of lower memory cells connected to the plurality of bit lines, a plurality of upper memory cells above the plurality of bit lines, the plurality of upper memory cells connected to the plurality of bit lines, a plurality of cell array regions and a plurality of bit line contact regions alternately arranged in the first direction, the plurality of cell array regions including the plurality of upper memory cells and the plurality of lower memory cells, and only one of either the plurality of upper memory cells or the plurality of lower memory cells are arranged in at least one of the plurality of bit line contact regions.

In at least one example embodiment, a memory device includes a plurality of bit lines located at different heights from an upper surface of a substrate, the plurality of bit lines extending in a first direction, parallel to the upper surface of the substrate, a plurality of word lines located at a height different from the heights of the plurality of bit lines in a direction perpendicular to the upper surface of the substrate, the plurality of word lines extending in a second direction, the second direction intersecting the first direction, and a plurality of memory layers each including a plurality of memory cells arranged between the plurality of bit lines and the plurality of word lines adjacent to each other in the direction perpendicular to the upper surface of the substrate, and an uppermost memory layer of the plurality of memory layers includes a number of memory cells greater than a number of memory cells included in each of remaining memory layers among the plurality of memory layers.

In at least one example embodiment, a memory device includes a substrate including a plurality of unit areas, a plurality of bit lines extending in a first direction, the first direction parallel to an upper surface of the substrate, a plurality of lower word lines between the plurality of bit lines and the upper surface of the substrate, the plurality of lower word lines extending in a second direction, the second direction parallel to the upper surface of the substrate and intersecting the first direction, a plurality of upper word lines extending in the second direction, the plurality of upper word lines above the plurality of bit lines, a plurality of word line contact regions including a plurality of upper word line contacts connected to the plurality of upper word lines, the plurality of word line contact regions between the plurality of unit areas, a plurality of memory cells between the plurality of bit lines and the plurality of lower word lines, the plurality of memory cells also between the plurality of bit lines and the plurality of upper word lines, and the plurality of upper word lines is greater than the plurality of lower word lines.

BRIEF DESCRIPTION OF THE DRAWINGS

The above and other aspects, features, and advantages of the example embodiments of the present inventive concepts will be more clearly understood from the following detailed description, taken in conjunction with the accompanying drawings, in which.

DETAILED DESCRIPTION

Figure 1:
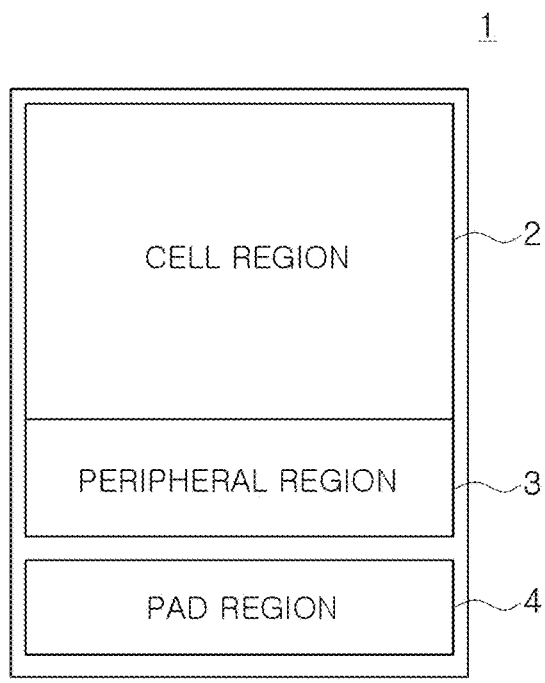
FIGS. 1 and 2 are diagrams schematically illustrating a memory device according to at least one example embodiment.

Hereinafter, various example embodiments will be described with reference to the accompanying drawings. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may be omitted.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Figure 2:
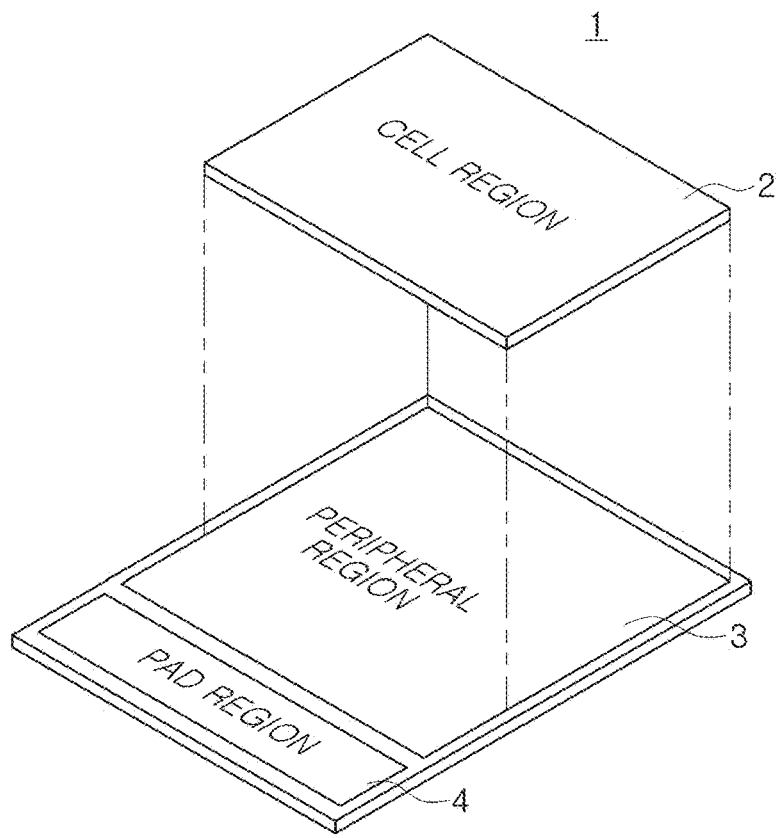

FIGS. 1 and 2 are diagrams schematically illustrating a memory device according to at least one example embodiment;

Referring first to FIG. 1, a memory device 1 according to at least one example embodiment may include have a cell region 2, a peripheral circuit region 3, and/or a pad region 4, etc., but the example embodiments are not limited thereto. In the cell region 2, memory cells, word lines, and/or bit lines connected to the memory cells are formed, and the cell region 2 may include a plurality of unit areas. The pad region 4 may be an area in which a plurality of pads for inputting and/or outputting control commands and data are formed, and the peripheral circuit region 3 is an area in which various circuits desired and/or required for the operation of the memory device 1 are formed.

According to some example embodiments, memory cells included in the cell region 2 may be in a plurality of layers, but the example embodiments are not limited thereto. For example, at least portions of the memory cells in different layers may also share word lines and/or bit lines, etc.

The peripheral circuit region 3 may include a decoder circuit, a read/write circuit, a power supply circuit, and/or control logic circuitry, etc., but the example embodiments are not limited thereto. The control logic circuitry may control the decoder circuit, the read/write circuit, the power supply circuit, and the like, but the example embodiments are not limited thereto. For example, the decoder circuit may determine at least one of the memory cells formed in the cell region 2 as a selected memory cell, and the read/write circuit may read data from the selected memory cell and/or write data to the selected memory cell. In at least one example embodiment, at least a portion of the circuits included in the peripheral circuit region 3 may also be below the cell region 2, which will be described with reference to FIG. 2 below, but is not limited thereto.

Referring to FIG. 2, at least a portion of the peripheral circuit region 3 may be below the cell region 2 in the memory device 1 according to at least one example embodiment, but is not limited thereto. For example, a decoder circuit connected to word lines and/or bit lines and a read/write circuit for reading and/or writing data may be below the cell region 2. Because the decoder circuit connected to the word lines and the bit lines included in the cell region 2 are located below the cell region 2, the electrical characteristics of the memory device may be improved.

In at least one example embodiment, the decoder circuit may include a word line decoder connected to the word lines, and a bit line decoder connected to the bit lines, etc. As described above, the memory cells may be in a plurality of layers in the cell region 2, and the memory cells in different layers may be connected to different word lines and/or different bit lines. In the cell region 2, memory cells, word lines, and bit lines may be connected in a crosspoint structure, but the example embodiments are not limited thereto.

For example, upper memory cells may be connected to upper word lines, and lower memory cells in a lower layer than the upper memory cells may be connected to lower word lines, but the example embodiments are not limited thereto. The upper word lines and the lower word lines may share one-word line decoder, or may be connected to different word line decoders according to some example embodiments, but are not limited thereto. According to some example embodiments, different word line decoders may also be connected to a single read/write circuit, but is not limited thereto.

For example, the cell region 2 may include lower word lines, lower memory cells, bit lines, upper memory cells, and/or upper word lines, etc., sequentially stacked on the peripheral circuit region 3. Since there are no other word lines, bit lines, and/or memory cells, etc., between the lower word lines and the peripheral circuit region 3, the lower word lines may be connected to the peripheral circuit region 3 without any restriction or less restrictions.

On the other hand, the bit lines and the upper word lines may need to be connected to the peripheral circuit region 3 to avoid interference of the memory cells and the lower word lines. For example, memory cells may not be in a bit line contact region in which the bit lines and the peripheral circuit region 3 are connected. In at least one example embodiment, the lower memory cells may be omitted in the bit line contact region, and the upper memory cells may be connected to the bit line contact region, thereby improving the integration degree of the memory device 1. In addition, by utilizing the upper memory cells in the bit line contact region for redundancy and/or testing, the reliability of the memory device 1 may be improved.

Figure 3:
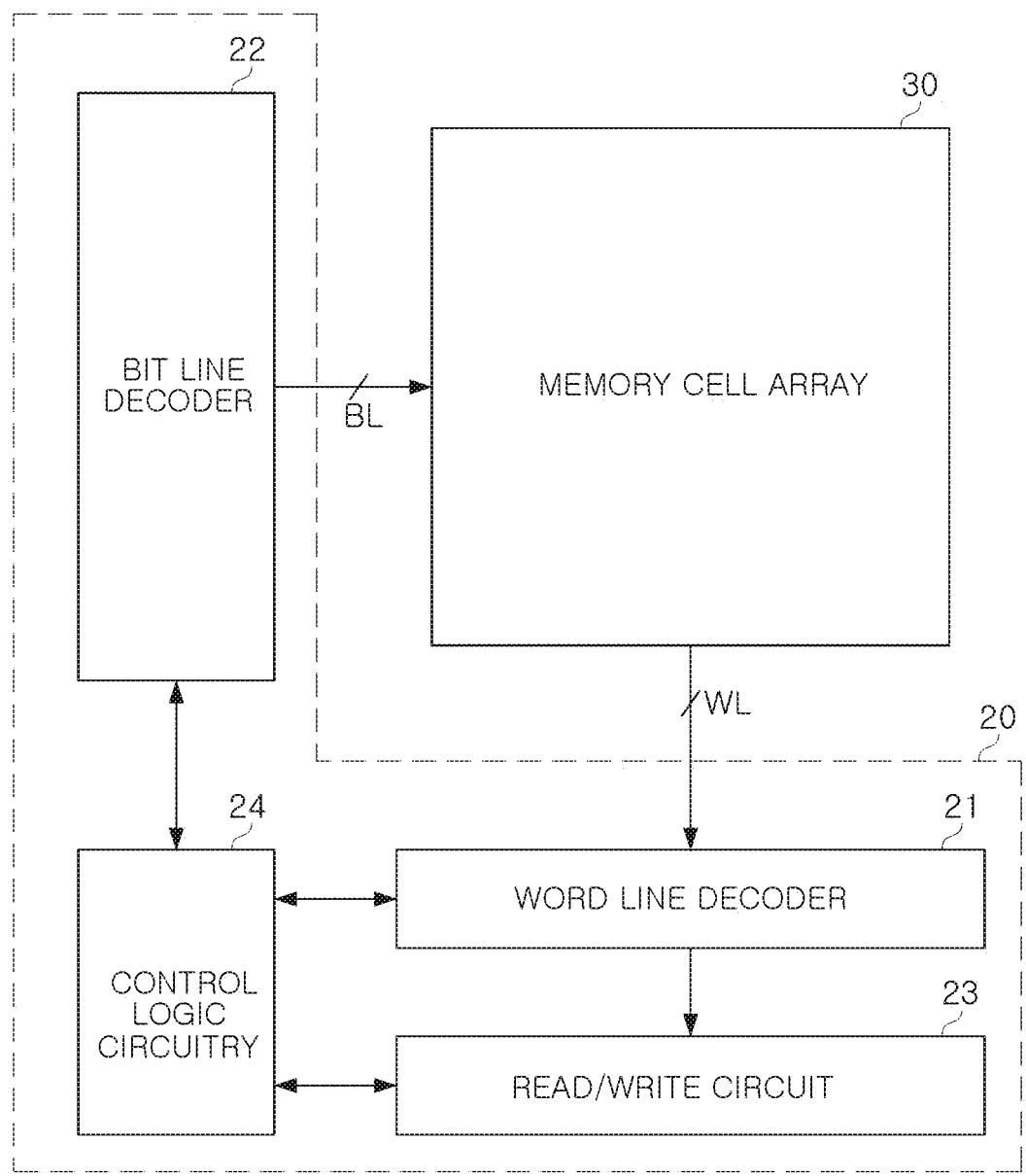
FIG. 3 is a block diagram schematically illustrating a memory device according to at least one example embodiment.

FIG. 3 is a block diagram schematically illustrating a memory device according to at least one example embodiment.

The memory device 10 according to at least one example embodiment may include a memory controller 20 and/or a memory cell array 30, etc. The memory controller 20 may include decoder circuits 21 and 22, read/write circuits 23, a control logic circuitry 24, and the like. The memory cell array 30 may include a plurality of memory cells. The decoder circuits 21 and 22 may include a word line decoder 21 connected to a plurality of memory cells through a word line WL, and a bit line decoder 22 connected to the plurality of memory cells through a bit line BL, etc. Operations of the word line decoder 21, the bit line decoder 22, and the read/write circuit 23 may be controlled by the control logic circuitry 24. The control logic circuitry 24 may include hardware including logic circuits; a hardware/software combination such as at least one processor executing software; or a combination thereof. For example, the control logic circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. In at least one example embodiment, the read/write circuit 23 may include a program circuit writing data to at least one selected memory cell specified by the word line decoder 21 and the bit line decoder 22, and a readout circuit reading data from the selected memory cell, and the like.

As described above, the word line decoder 21 and the bit line decoder 22 may be below the memory cell array 30, but is not limited thereto. Therefore, the wiring connecting the word lines WL and the word line decoder 21, and/or connecting the bit lines BL and the bit line decoder 22 may be further simplified. According to some example embodiments, the read/write circuit 23 may also be below the memory cell array 30, together with the word line decoder 21 and the bit line decoder 22.

FIGS. 4 to 7 are diagrams illustrating an arrangement of memory cells in a memory device according to some example embodiments. FIGS. 4 to 7 may be schematic diagrams illustrating memory cells, word lines, and bit lines included in a memory device.

Figure 4:
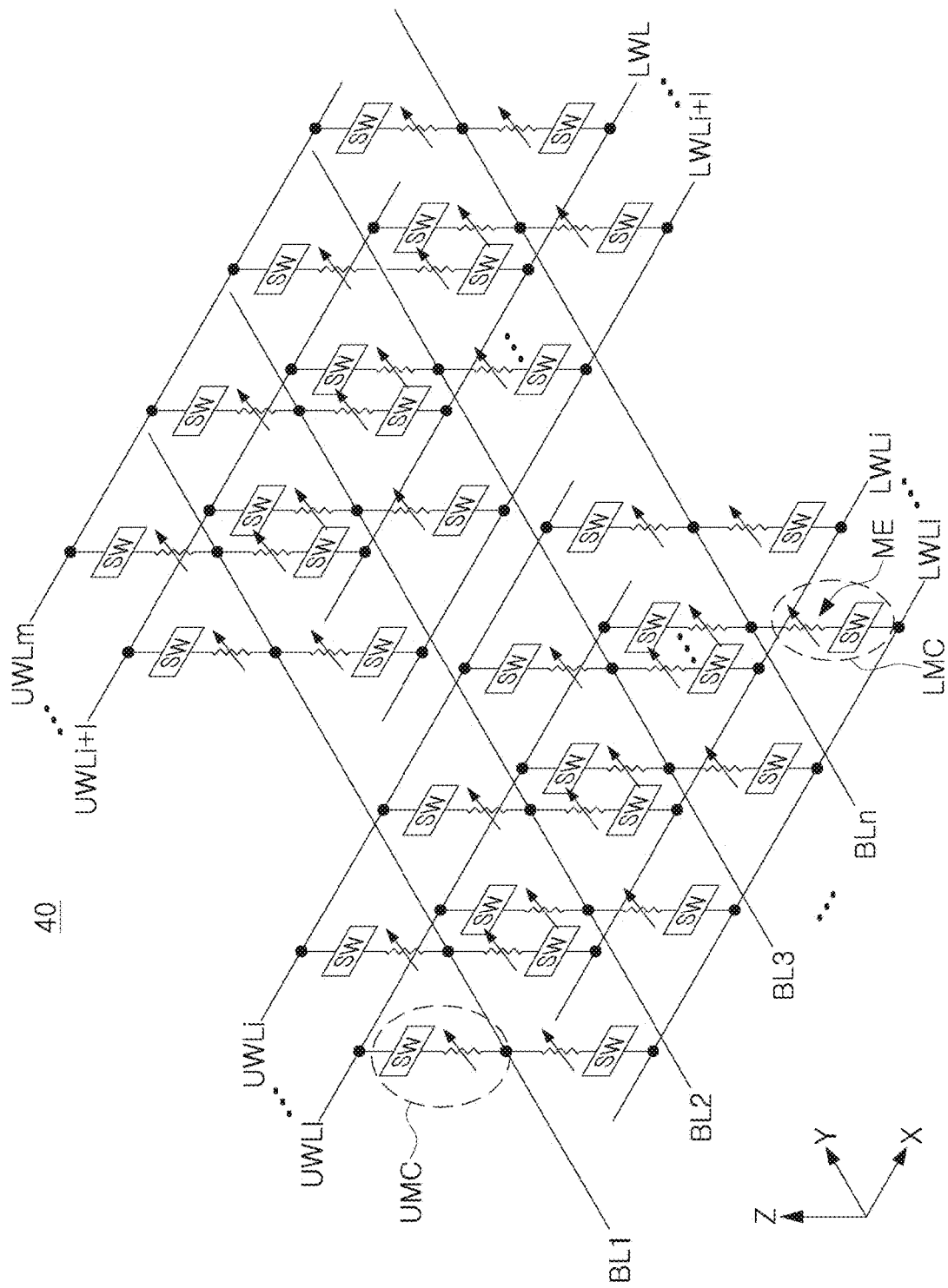
FIGS. 4 to 7 are diagrams illustrating an arrangement of memory cells in a memory device according to at least one example embodiment.
Figure 5:
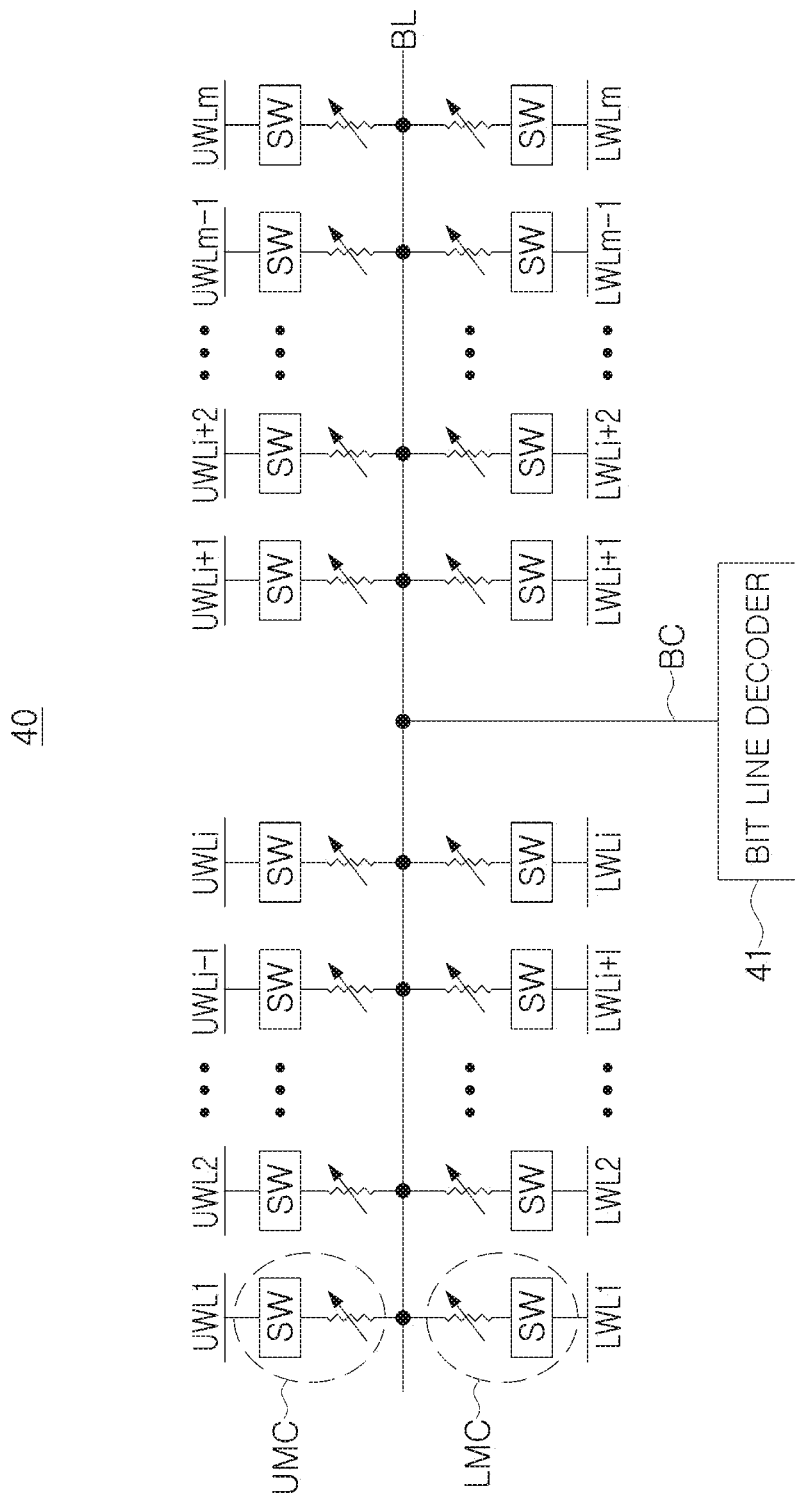

FIGS. 4 and 5 may be views illustrating comparative examples to describe a memory device according to some example embodiments. Referring to FIGS. 4 and 5, a memory cell array 40 may include bit lines BL1 to BLn extending in a first direction (e.g., a Y-axis direction, etc.) and word lines LWL1 to LWLm and UWL1 to UWLm extending in a different direction than the bit lines BL1 to BLn, such as a second direction (e.g., an X-axis direction, etc.), but the example embodiments are not limited thereto. The first direction and the second direction are directions intersecting each other, and may be perpendicular to each other, for example, but are not limited thereto.

Lower memory cells LMC may be between the bit lines BL1 to BLn and the lower word lines LWL1 to LWLm, and upper memory cells UMC may be between the bit lines BL1 to BLn and the upper word lines UWL1 to UWLm. The lower memory cells LMC and the upper memory cells UMC may have the same structure, but is not limited thereto.

For example, each of the lower memory cells LMC and the upper memory cells UMC may include a switching element SW and/or a memory element ME, etc. In at least one example embodiment, the switching element SW may include at least one of a PN junction diode, a Schottky diode, and/or an ovonic threshold switch (OTS), etc., or any combinations thereof. In at least one example embodiment, the memory element ME may be formed using a phase change material including a chalcogenide material and/or a super-lattice, etc., but is not limited thereto. For example, the memory element ME may include a phase change material capable of enabling phase transition between an amorphous phase and a crystalline phase based on a heating period of time and a temperature. The memory element ME and the switching element SW may be connected to each other in series, but is not limited thereto. The order in which the memory element ME and the switching element SW are connected is not limited and may be modified. For example, the memory element ME and the switching element SW may be sequentially connected between the word lines LWL1 to LWLm and UWL1 to UWLm and the bit lines BL1 to BLn, etc.

Referring to FIGS. 4 and 5, the lower word lines LWL1 to LWLm, the upper word lines UWL1 to UWLm, and the memory cells LMC and UMC may not be in at least some regions. Therefore, as illustrated in FIGS. 4 and 5, a relatively large space may be secured between portions of lower word lines LWL1 to LWLm and upper word lines UWL1 to UWLm, but is not limited thereto. The space may be a bit line contact region in which the bit lines BL1 to BLm are connected to a bit line decoder 41 through a bit line contact BC, etc.

Figure 6:
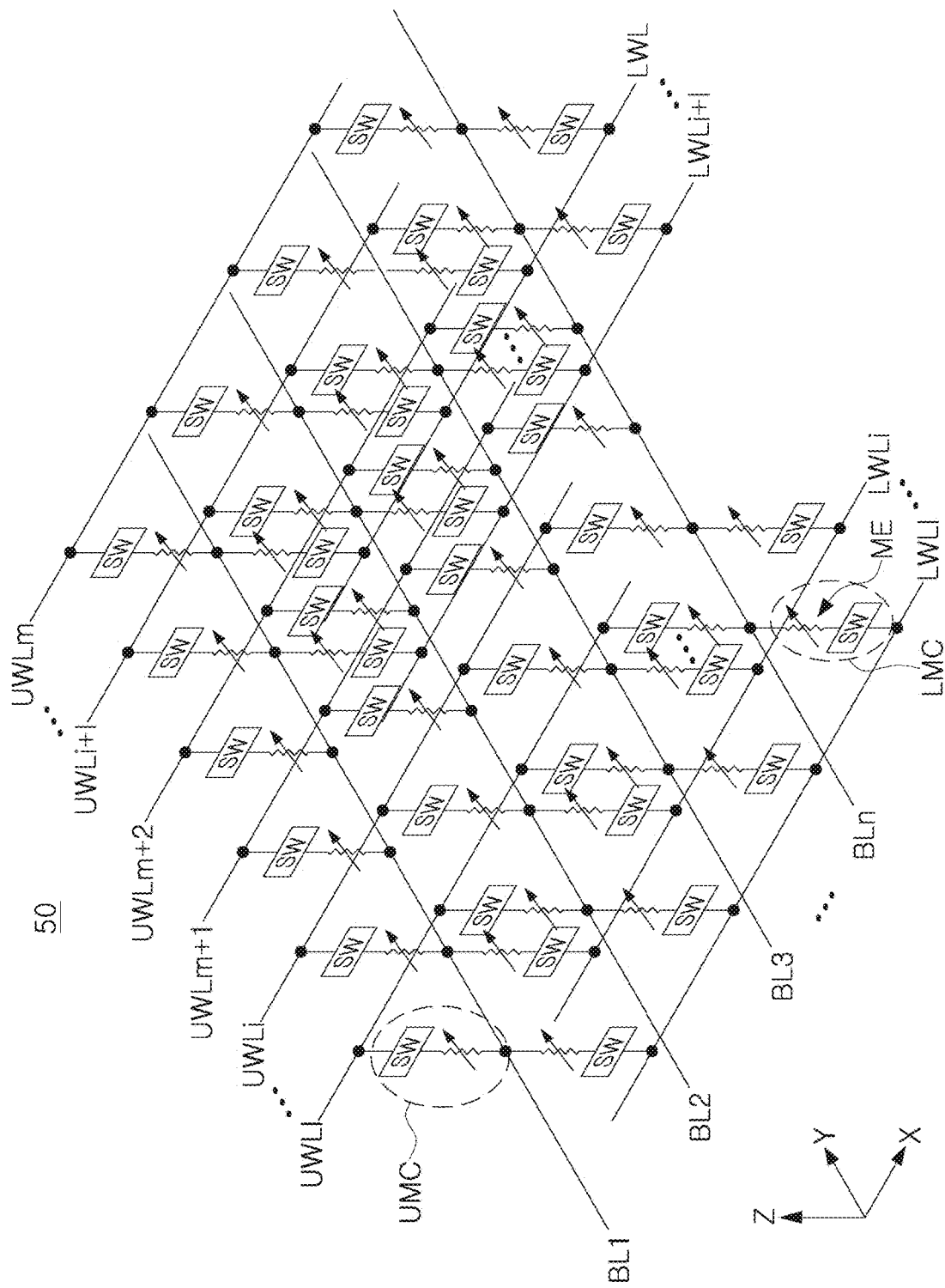
Figure 7:
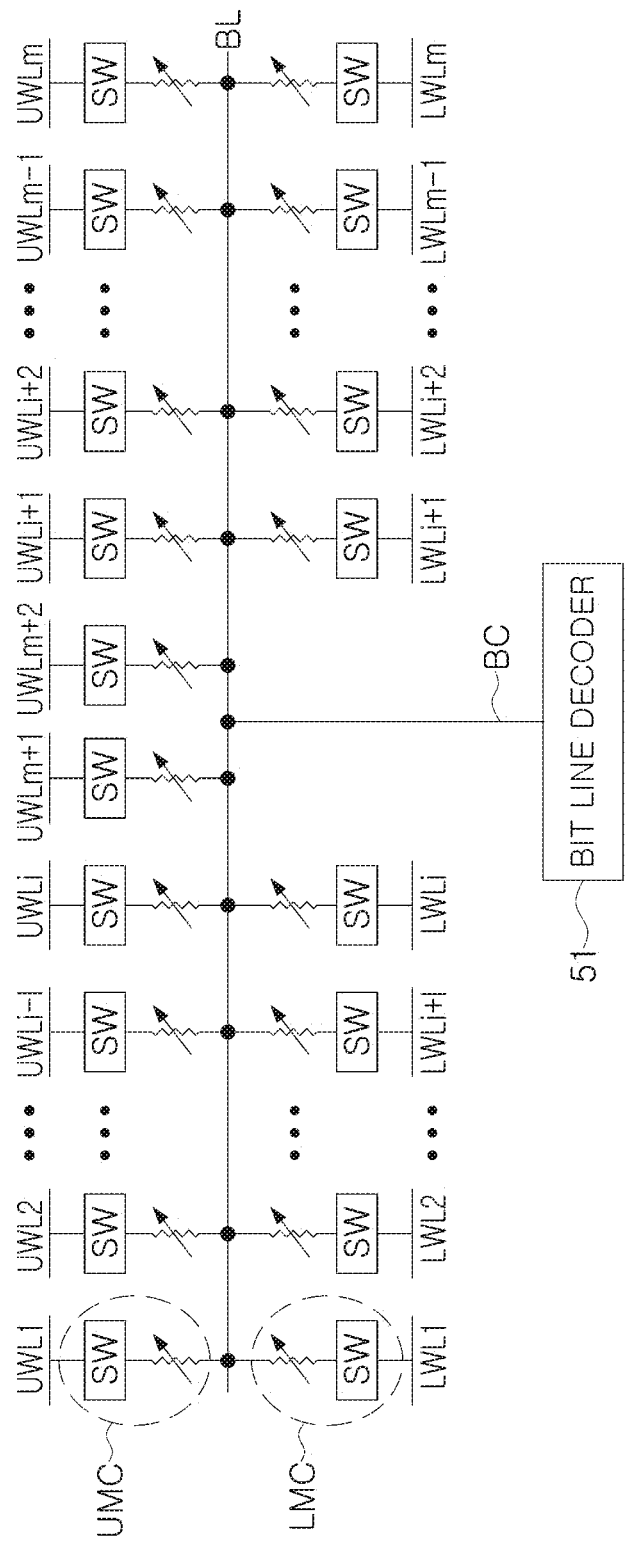

FIGS. 6 and 7 are schematic views of a memory cell array 50 included in a memory device according to some example embodiments. Referring to FIGS. 6 and 7, the memory cell array 50 includes bit lines BL1 to BLn extending in a first direction (e.g., a Y-axis direction, etc.) and word lines LWL1 to LWLm and UWL1 to UWLm extending in a different direction than the bit lines BL1 to BLn, such as a second direction (e.g., an X-axis direction, etc.), but is not limited thereto. Lower memory cells LMC may be between the bit lines BL1 to BLn and the lower word lines LWL1 to LWLm, and upper memory cells UMC may be between the bit lines BL1 to BLn and the upper word lines UWL1 to UWLm. The lower memory cells LMC and the upper memory cells UMC may have the same structure, but is not limited thereto. Each of the memory cells LMC and UMC may include a memory element ME and a switching element SW. As described above, the order in which the memory element ME and the switching element SW are connected is not limited and may be modified. In addition, in the lower memory cells LMC and the upper memory cells UMC, the connection orders of the memory element ME and the switching element SW may be different from each other.

Referring to FIGS. 6 and 7, in some example embodiments, upper word lines UWLm+1 and UWLm+2 and the upper memory cells UMC may be further in a bit line contact region in which the bit lines BL1 to BLn are connected to a bit line decoder 51 through a bit line contact BC. For example, only the upper word lines UWLm+1 and UWLm+2 and the upper memory cells UMC may be in the bit line contact region, but the example embodiments are not limited thereto, and according to some other example embodiments, the lower word lines LWL1 to LWLm and the lower memory cells LMC may be in the bit line contact region. Therefore, the degree of integration of the memory device may be improved as compared with the example embodiments illustrated in FIGS. 4 and 5.

Additionally, the reliability of the memory device may be improved by using the upper memory cells UMC in the bit line contact region for redundancy. Since the upper memory cells UMC in the bit line contact region are connected to the added upper word lines UWLm+1 and UWLm+2, the upper memory cells UMC in the bit line contact region may be utilized for word line redundancy. For example, in a case in which a word line that is determined to be bad (e.g., defective, non-functional, etc.) among the lower word lines LWL1 to LWLm and the upper word lines UWL1 to UWLm is found, the word line may be replaced with the upper word lines UWLm+1 and UWLm+2 added to the bit line contact region.

In at least one example embodiment, the upper memory cells UMC in the bit line contact region may be used for testing the memory device. In a test process after fabricating the memory device, the test may be performed on the upper memory cells UMC in the bit line contact region, instead of general memory cells, thereby significantly reducing the stress on general memory cells, and thus improving the reliability of the memory device.

Figure 8:
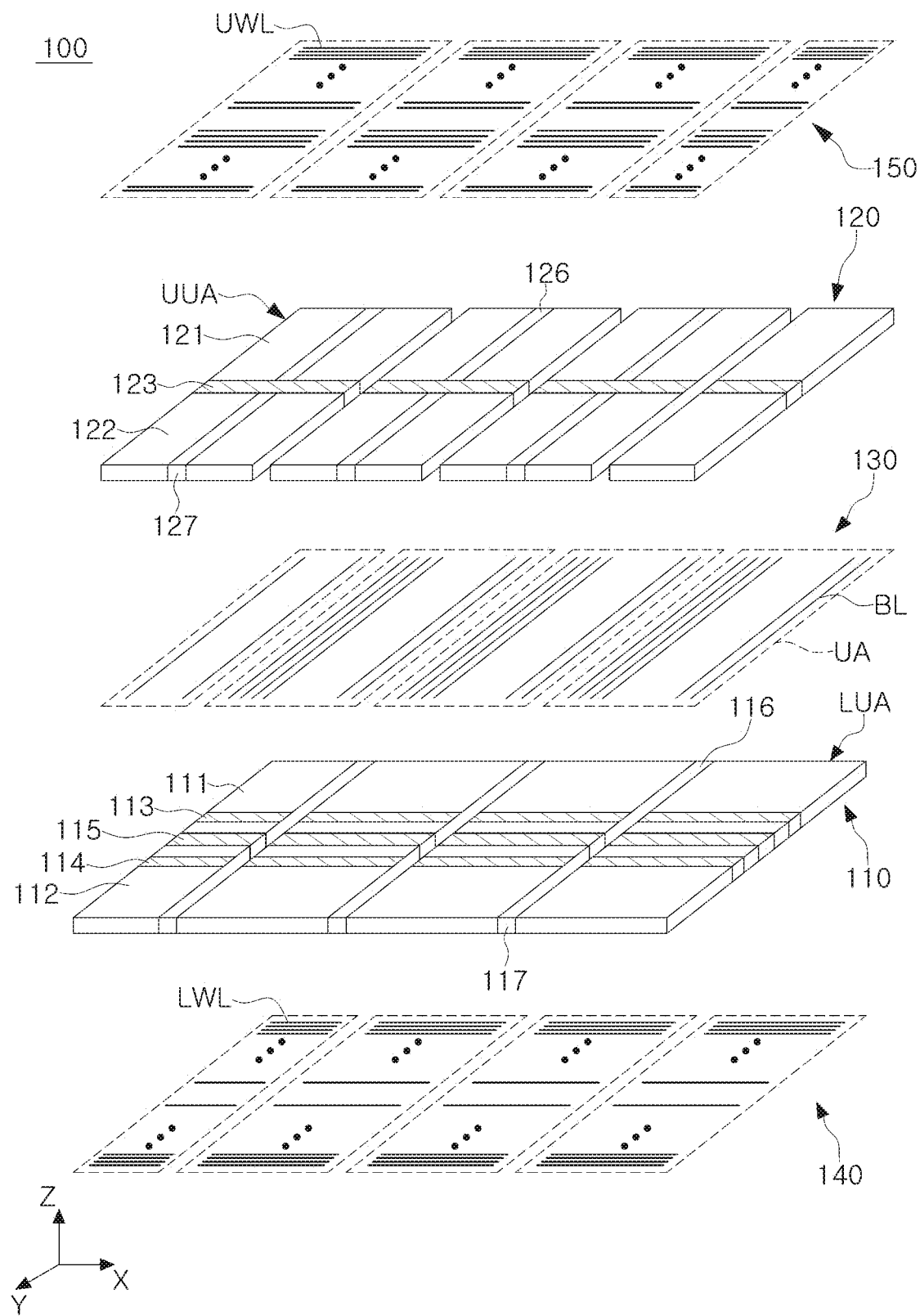
FIG. 8 is a view illustrating a stacked structure of a memory device according to at least one example embodiment.

FIG. 8 is a view illustrating a stacked structure of a memory device according to at least one example embodiment.

Referring to FIG. 8, a memory device 100 according to at least one example embodiment may include a plurality of layers 110 to 150, etc., but is not limited thereto. The plurality of layers (e.g., layers 110 to 150, etc.) may include a lower memory layer 110, an upper memory layer 120, a bit line layer 130, a lower word line layer 140, an upper word line layer 150, and the like. The bit line layer 130 includes a plurality of bit lines BL, the lower word line layer 140 includes a plurality of lower word lines LWL, and the upper word line layer 150 includes a plurality of upper word lines UWL.

The lower memory layer 110 may include a plurality of lower memory cells, and the lower memory layer 110 may be between the bit line layer 130 and the lower word line layer 140, but is not limited thereto. The lower memory cells may be respectively connected to at least one of the bit lines BL and at least one of the lower word lines LWL. The upper memory layer 120 may include a plurality of upper memory cells, and the upper memory layer 120 may be between the bit line layer 130 and the upper word line layer 150, but is not limited thereto. The upper memory cells may be respectively connected to at least one of the bit lines BL and at least one of the upper word lines UWL. According to at least one example embodiment, the upper memory cells and the lower memory cells may share the bit lines BL, but is not limited thereto. For example, the upper memory cells may be connected to upper surfaces of the bit lines BL, and the lower memory cells may be connected to lower surfaces of the bit lines BL, respectively.

According to some example embodiments, only one of the top and bottom surfaces of the bit lines BL may be connected to the memory cells, or in other words, a single surface of the bit lines BL may be connected to the memory cells, etc. For example, the bit lines BL may not be shared between the upper memory cells above the bit lines BL and the lower memory cells below the bit lines BL. In this case, the lower memory cells in the lower memory layer 110 and the upper memory cells in the upper memory layer 120 may be connected to different bit lines BL.

The memory device 100 may include a plurality of unit areas UA. The unit areas UA may be areas extending in the first direction (e.g., a Y-axis direction, etc.) and the second direction (e.g., a X-axis direction, etc.), but the example embodiments are not limited thereto. In each of the unit areas UA, the bit lines BL may extend in the first direction, and the upper word lines UWL and the lower word lines LWL may extend in a different direction than the bit lines BL, such as the second direction, but the example embodiments are not limited thereto.

In each of the unit areas UA, the number of bit lines BL may be different from the number of upper word lines UWL and/or lower word lines LWL, or may be the same. For example, according to at least one example embodiment, the number of upper word lines UWL may be greater than the number of bit lines BL, and the number of lower word lines LWL may also be greater than the number of bit lines BL. For example, the number of upper word lines UWL and/or the number of lower word lines LWL may be equal to twice the number of bit lines BL, but are not limited thereto. In addition, in at least one example embodiment, the length of each of the unit areas UA in the first direction may be greater than the length in the second direction, and for example, may be two or more times the length thereof in the second direction, but are not limited thereto.

In addition, the number of word lines connected to the memory cells storing data, among the upper word lines UWL and the lower word lines LWL, may be more than the number of bit lines BL connected to the memory cells storing actual data, or may be the same, etc. In detail, except for memory cells utilized for redundancy and/or test purposes of the memory device, the number of word lines connected to the memory cells storing data may be greater than the number of bit lines BL connected to the memory cells storing data according to at least one example embodiment, but is not limited thereto. For example, the number of word lines connected to memory cells storing data may be twice or more than the number of bit lines BL connected to memory cells storing data, but is not limited thereto.

The lower memory layer 110 may include a plurality of cell array regions, such as cell array regions 111 and 112, etc., and/or a plurality of bit line contact regions, such as bit line contact regions 113 to 115, etc. The cell array regions 111 and 112 and the bit line contact regions 113 to 115 may be alternately arranged (e.g., layered, stacked, etc.) in the first direction. For example, the lower memory cells may be located only in the cell array regions 111 and 112, and may not be located in the bit line contact regions 113 to 115. Accordingly, the lower word lines UWL may also be located only in the cell array regions 111 and 112.

The bit line contact regions 113 to 115 may be regions in which the bit lines BL are connected to bit line contacts extending in a third direction (e.g., a Z-axis direction, etc.), but is not limited thereto. The bit line contacts connected to the bit lines BL may be connected to circuit devices below the lower word line layer 140 and the lower memory layer 110. Accordingly, lower memory cells LMC and lower word lines LWL may not be on the bit line contact regions 113 to 115 to secure space for connecting the bit lines BL and the bit line contacts.

The lower memory layer 110 may be divided into a plurality of lower unit areas LUA. The lower word lines LWL may be separated between the plurality of lower unit areas LUA. Also, word line contact regions 116 and 117 may be between the plurality of lower unit areas LUA.

The bit line layer 130 may be divided into a plurality of unit areas UA. The unit areas UA dividing the bit line layer 130 may correspond to the lower unit areas LUA. For example, the space between the unit areas UA may correspond to the word line contact regions 116 and 117 between the lower unit areas LUA.

The upper memory layer 120 may include cell array regions 121 and 122 and bit line contact regions 123 that are alternately arranged (e.g., layered, stacked, etc.) in the first direction. The upper memory cells and the upper word lines UWL may be only in the cell array regions 121 and 122 and may not be in the bit line contact region 123. However, bit line contacts connected to the bit lines BL may not be in the bit line contact region 123 in the upper memory layer 120, and in this case, the upper memory cells and the upper word lines UWL may also be in the bit line contact region 123, but is not limited thereto.

The upper memory layer 120 may include a plurality of upper unit areas UUA, and the upper unit areas UUA and the lower unit areas LUA may be arranged, for example, in a zigzag manner in a second direction, but the example embodiments are not limited thereto. For example, the space between the upper unit areas UUA may be located in the center of the lower unit areas LUA, etc.

Word line contact regions 126 and 127 included in each of the upper unit areas UUA may correspond to the word line contact regions 116 and 117 between the lower unit areas LUA. In addition, the bit lines BL may not be below the word line contact regions 126 and 127 included in each of the upper unit areas UUA, or in other words, the bit lines BL may not be in physical contact with the word line contact regions 126 and 127. Accordingly, word line contacts connected to the upper word lines UWL may be connected to circuit devices below the lower word line layer 140 through the word line contact regions 126 and 127 of the upper memory layer 120 and the word line contact regions 116 and 117 of the lower memory layer 110, etc.

In at least one example embodiment illustrated in FIG. 8, the upper memory layer 120 may be an uppermost layer of the memory layers included in the memory device 100, and memory layers may be further below the lower memory layer 110, but is not limited thereto. In at least one example embodiment, since in memory layers other than the uppermost memory layer, a space for the connection of the bit line contact and the bit lines BL should be secured, the memory cells may not be located in the bit line contact regions 113 to 115. On the other hand, in the uppermost memory layer, memory cells may be located without any restriction, or less restriction, due to the connection of bit lines BL and bit line contacts.

According to some example embodiments, memory cells may be further located on an upper portion of the upper word line layer 110 and/or below the lower word line layer 110. In at least one example embodiment, the memory cells on the upper word line layer 150 may also share the upper word lines UWL with the upper memory cells included in the upper memory layer 120, but is not limited thereto. Additionally, additional word lines may be further formed on the upper word line layer 150, and memory cells may also be connected to the additionally formed word lines. Similarly, the memory cells located below the lower word line layer 110 may or may not share the lower word lines LWL with the lower memory cells.

Figure 9:
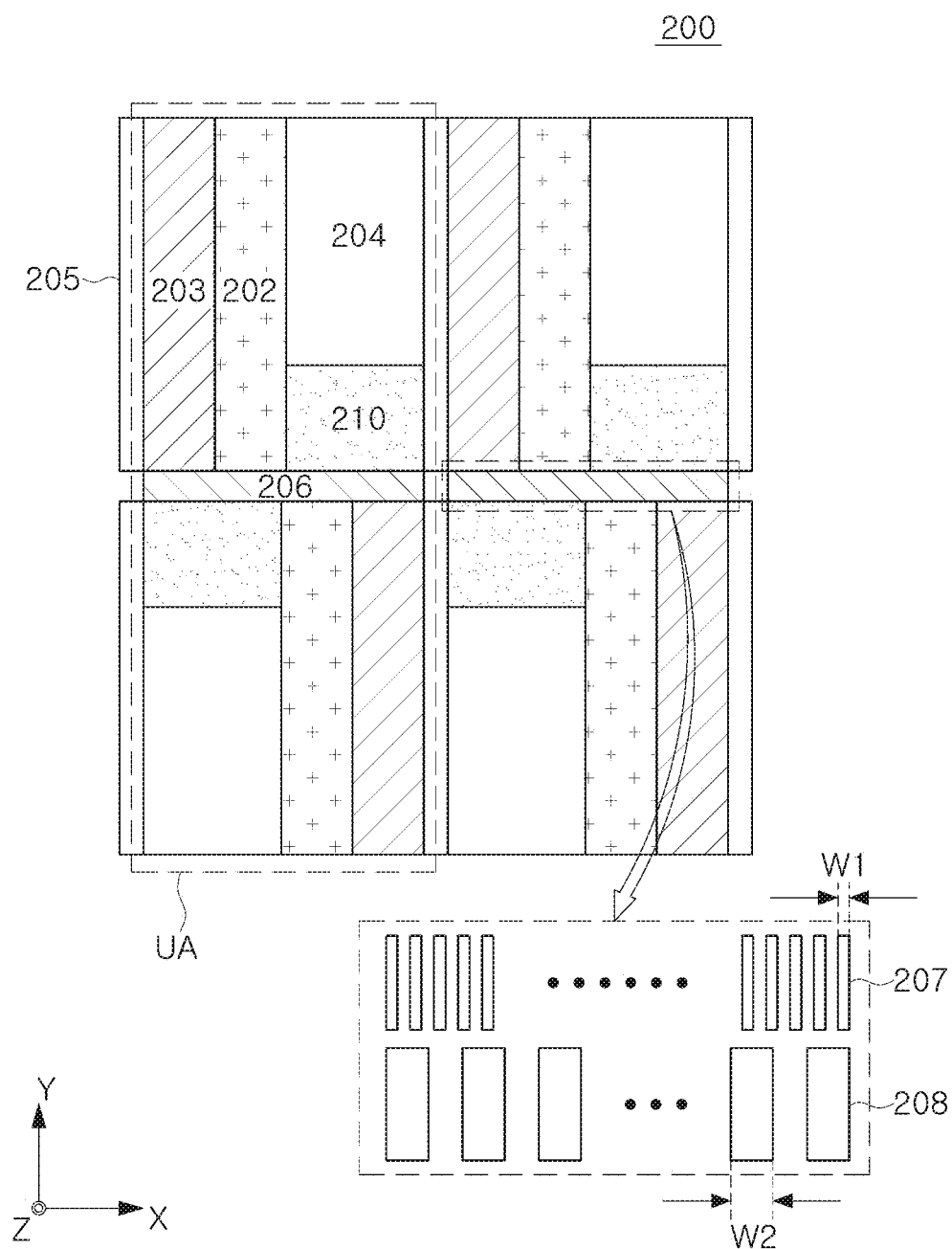
FIG. 9 is a diagram of a comparative example to describe a planar structure of a memory device according to at least one example embodiment.

FIG. 9 is a diagram of a comparative example to describe a planar structure of a memory device according to at least one example embodiment.

FIG. 9 may be a plan view illustrating a portion of a peripheral circuit region below memory cells in a memory device 200. Referring to FIG. 9, the peripheral circuit region may be divided into unit areas UA. The unit areas UA may be at least two-dimensional, and for example, arranged in the first direction (e.g., a Y-axis direction, etc.) and the second direction (e.g., a X-axis direction, etc.), but the example embodiments are not limited thereto. Memory cells, bit lines, and/or word lines, etc., may be on the peripheral circuit region in the third direction (e.g., Z-axis direction, etc.), but are not limited thereto.

The peripheral circuit region may include a bit line decoder region 201, a plurality of word line decoder regions 202 and 203, a circuit region 204, a word line contact region 205, a bit line contact region 206, and the like. The word line contact region 205 may be between the unit areas UA, and each of the unit areas UA may include at least a first unit area and a second unit area, etc., separated by the bit line contact region 206 in the first direction.

A bit line decoder connected to bit lines through bit line contacts may be in the bit line decoder region 201. In at least one example embodiment, the bit lines may be above the peripheral circuit region in the third direction, and may extend in the first direction. The bit line decoder may include switching devices connected to the bit line contacts, and at least one of the bit lines may be selected depending on on/off operations of the switching devices, but the example embodiments are not limited thereto.

The word line decoder regions 202 and 203 may include a lower word line decoder region 202 and/or an upper word line decoder region 203, etc., but is not limited thereto. A lower word line decoder in the lower word line decoder region 202 may be connected to lower word lines through a first set of word line contacts, and an upper word line decoder in the upper word line decoder region 203 may be connected to the upper word lines through a second set of word line contacts, e.g., other word line contacts.

The lower word lines and the upper word lines may extend in the second direction, and the lower word lines are between the peripheral circuit region and the bit lines in the third direction, and the upper word lines are on the bit lines in the third direction, but the example embodiments are not limited thereto. The lower word line decoder and the upper word line decoder may include switching devices connected to word line contacts, and at least one of the lower word lines and the upper word lines may be selected according to on/off of the switching devices, but the example embodiments are not limited thereto.

Bit line contacts connected to bit lines 207 may be formed in the bit line contact region 206. In addition, circuit wires 208 connected to elements in the bit line decoder region 201 may extend to the bit line contact region 206. Referring to FIG. 9, a width W1 of each of the bit lines 207 may be, for example, less than a width W2 of each of circuit wires 208, but are not limited thereto. There is a limit to reducing the width W2 of each of the circuit wires 208, and all of the bit line contacts connected to the bit lines BL included in each of the unit areas UA may not be connected to the circuit wires 208 in one-bit line contact region 206.

In at least one example embodiment of the present inventive concepts, the bit line contacts and the circuit wires may be connected with a plurality of bit line contact regions in each of the unit areas UA. In addition, memory cells may be above the bit lines in at least one of the bit line contact regions. Therefore, deterioration in the integration degree of the memory device due to an increase in the number of bit line contact regions may be reduced and/or prevented, and therefore the performance, efficiency, and/or lifespan of the memory device may be improved.

Figure 10:
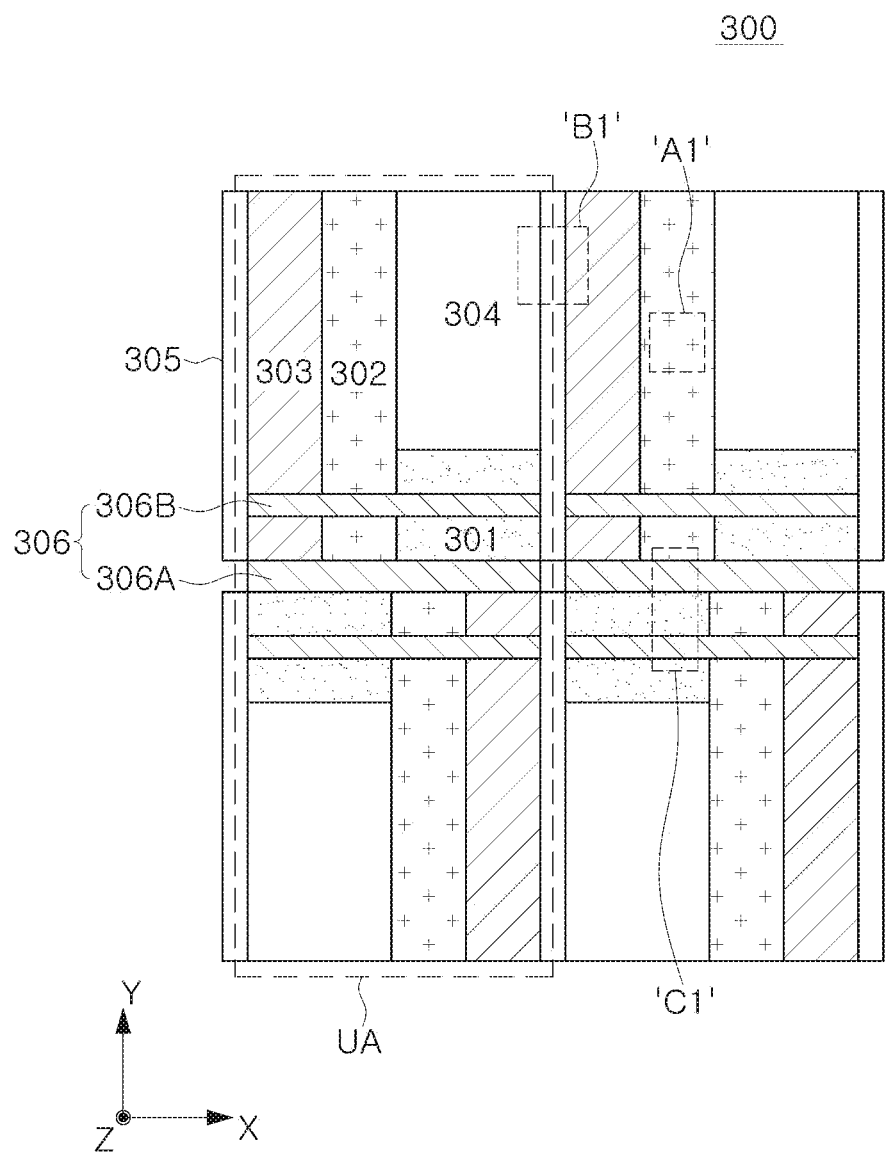
FIG. 10 is a diagram schematically illustrating a planar structure of a memory device according to at least one example embodiment.

FIG. 10 is a diagram schematically illustrating a planar structure of a memory device according to at least one example embodiment.

FIG. 10 may be a plan view illustrating a portion of a peripheral circuit region below the memory cells in a memory device 300. Referring to FIG. 10, the peripheral circuit region may include a plurality of unit areas UA arranged in a first direction (e.g., a Y-axis direction, etc.) and a second direction (e.g., a X-axis direction, etc.), but the example embodiments are not limited thereto. Memory cells, bit lines, and/or word lines, etc., may be above the peripheral circuit region in the third direction (e.g., a Z-axis direction, etc.).

The peripheral circuit region may include a bit line decoder region 301, a plurality of word line decoder regions 302 and 303, etc., a circuit region 304, a word line contact region 305, a bit line contact region 306, and the like, but the example embodiments are not limited thereto. The word line contact region 305 may be between the unit areas UA, and each of the unit areas UA may include a first unit area and/or a second unit area, etc., separated in the first direction by the bit line contact region 306. The bit line decoder region 301, the word line decoder regions 302 and 303, the circuit region 304, the word line contact region 305, and the bit line contact region 306, etc., may have a rotationally symmetrical structure with respect to the center of a first bit line contact region 306A in the respective unit areas UA, or in other words, the upper left quadrant of the memory device 300 (e.g., semiconductor device, etc.) of FIG. 10 may be symmetrical to the lower right quadrant of the memory device 300 across an origin point of a quadrant of the memory device 300, and similarly, the upper right quadrant of the memory device 300 may be symmetrical to the lower left quadrant of the memory device 300 an origin point of a quadrant of the memory device 300, etc.

A bit line decoder may be in the bit line decoder region 301, and a lower word line decoder and an upper word line decoder may be in the plurality of word line decoder regions 302 and 303. A circuit connected to at least one of the bit line decoder, the lower word line decoder, and the upper word line decoder may be in the circuit region 304. For example, a precharge circuit, a sense amplifier, and the like, may be in the circuit region 304, but the example embodiments are not limited thereto.

Referring to FIG. 10, the upper word line decoder may be closer to the word line contact region 305 than the lower word line decoder, but the example embodiments are not limited thereto. The lower word line decoder may be connected to lower word lines between the peripheral circuit region and the bit lines through the lower word line contacts. Therefore, there may be no restriction and/or less restrictions in the location of the lower word line decoder in the memory device. On the other hand, the upper word line contacts connected to the upper word line decoder may need to extend in the third direction without interference with the bit lines, the lower word lines, and the lower memory cells. Accordingly, the upper word line contacts are in the word line contact regions 305 between the unit areas UA, and the upper word line decoder may be close to the word line contact region 305 to significantly improve resistance characteristics and the like. Lower word line contacts may be shorter than upper word line contacts in the third direction, but the example embodiments are not limited thereto.

As described above with reference to FIG. 8, the lower word lines may be in the unit areas UA in the second direction, but is not limited thereto and may be arranged in other directions. On the other hand, the upper word lines may transverse a boundary between a pair of unit areas UA adjacent to each other, for example, in the second direction, and may be separated in an area adjacent to the center of each of the unit areas UA, for example, in the second direction. In an example, the upper word lines in the same position in, for example, the first direction, may be separated from each other in another direction, e.g., the second direction, on the boundary between the lower word line decoder region 302 and the circuit region 304, etc.

In at least one example embodiment, by properly arranging the lower word line decoder and the upper word line decoder within the memory device and/or semiconductor device, etc., skew between memory cells may be significantly reduced. For example, the lower word line decoder may be located near the center (and/or approximately at the center, etc.) of each of the unit areas UA, but is not limited thereto, and the upper word line decoder may be near a boundary (and/or approximately at the boundary, etc.) between the unit areas UA. For example, the lower word line decoder may be relatively closer to the center of each of the unit areas UA, and the upper word line decoder may be relatively closer to the boundary between the unit areas UA, but the example embodiments are not limited thereto.

The lower word line decoder may be connected to the lower word lines through the lower word line contacts, and the lower word line contacts may be in or around the lower word line decoder region 302. Similarly, the upper word line decoder may be connected to the upper word lines through the upper word line contacts, and the upper word line contacts may be in the word line contact region 305 between the unit areas UA. Thus, a distance between the lower word line decoder and the lower word line contacts and a distance between the upper word line decoder and the upper word line contacts may be reduced, and therefore the performance of the memory device may be improved and/or the physical size of the memory device may be decreased, etc.

The arrangement of the lower word line decoder may allow the lower word line contacts to be close to the center of the lower word lines, and the arrangement of the upper word line decoder may allow the upper word line contacts to be close to the center of the upper word lines. Thus, skew between the lower memory cells and skew between the upper memory cells may be significantly reduced.

Referring to FIG. 10, the lower word line decoder region 302 may be closer to the center of each of the unit areas UA than to the boundary between the unit areas UA in, for example, the second direction, but is not limited thereto. The upper word line decoder region 303 may be closer to the boundary between the unit areas UA than to the center of each of the unit areas UA in, for example, the second direction, but is not limited thereto. Accordingly, a distance between the upper word line decoder region 303 and the word line contact region 305 in which the upper word line contacts connected to the upper word lines may be reduced, and therefore the performance of the memory device may be improved and/or the physical size of the memory device may be decreased. Lower word line contacts connected to the lower word lines may be formed in, or around, the lower word line decoder region 302, etc.

In the example embodiment illustrated in FIG. 10, a plurality of bit line contact regions 306 may be located in each of the unit areas UA. The bit line contact regions 306 may be formed within the unit areas UA, and do not deviate (are not separate) from each of the unit areas UA in, e.g., the second direction, etc. For example, the length of each of the bit line contact regions 306 may be less than or equal to the length of each of the unit areas UA, e.g., in the second direction, etc.

Cell array regions in which memory cells are located, and bit line contact regions 306, may be alternately arranged (e.g., layered, stacked, etc.) in each of the unit areas UA in, e.g., the first direction, but is not limited thereto. The bit line contact regions 306 may include a first bit line contact region 306A that divides each of the unit areas UA into a first unit area and a second unit area, and a second bit line contact region 306B. The second bit line contact region 306B may extend in a different direction, e.g., the second direction, and may overlap at least a portion of the bit line decoder region 301 in the first direction. The length of the bit line decoder region 301 may be greater than the length of each of the bit line contact regions 306, for example, in the second direction, etc.

At least one of the bit line contact regions 306 may be between the word line contact regions 305 in, e.g., the second direction, etc. For example, the second bit line contact region 306B may be between the word line contact regions 305 in the second direction. On the other hand, the first bit line contact region 306A may not contact the word line contact region 305 in the direction of the second bit line contact region 306B, e.g., the second direction, etc. For example, referring to FIG. 10, the word line contact region 305 may not extend to the first bit line contact region 306A in, e.g., the first direction, etc.

Figure 11:
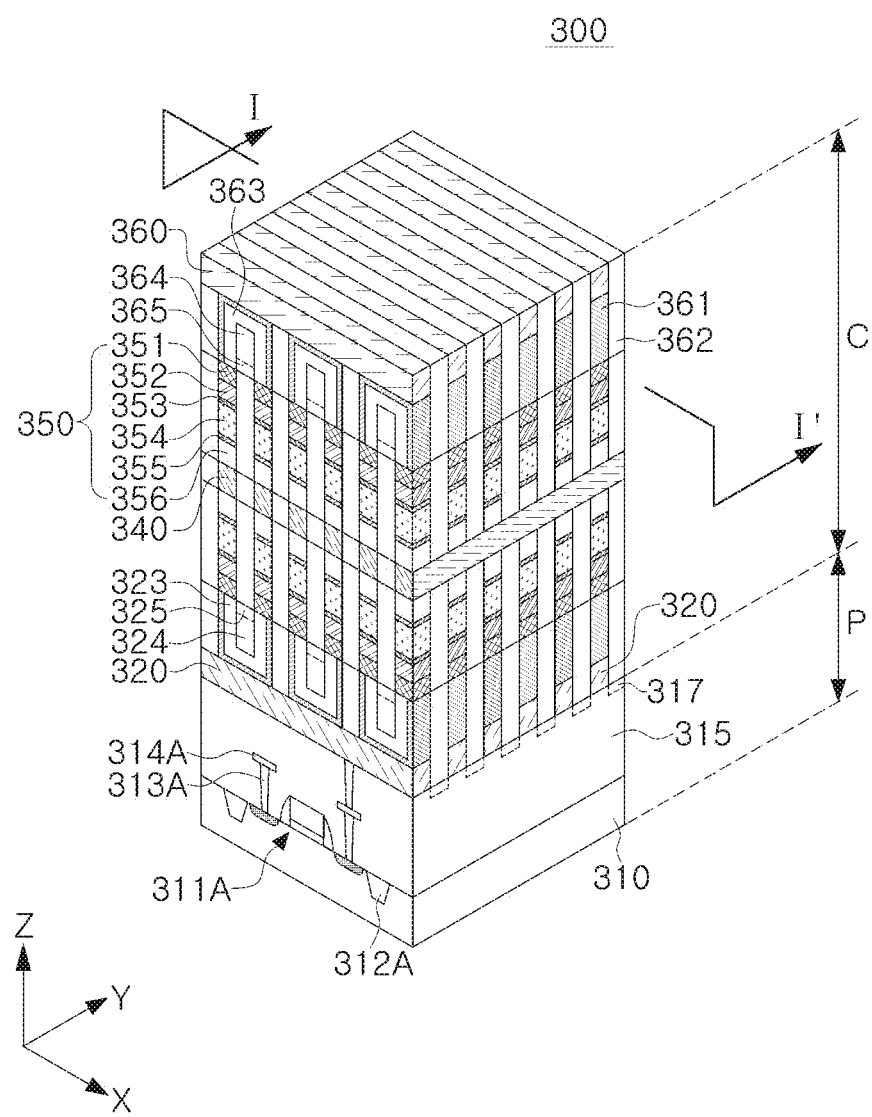
FIG. 11 is an enlarged perspective view of region A1 of FIG. 10 according to at least one example embodiment.
Figure 12:
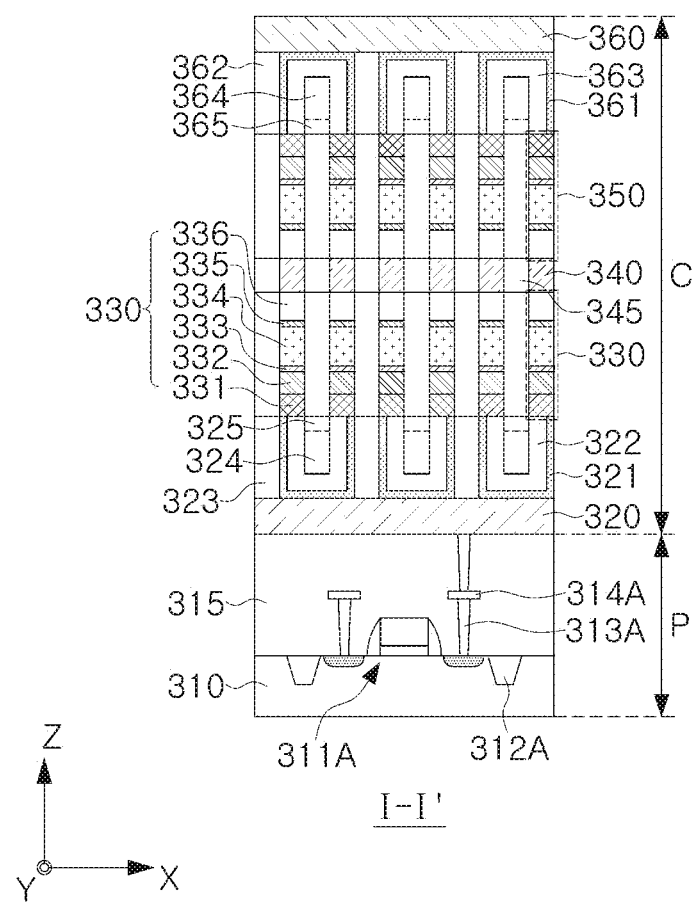
FIG. 12 is a cross-sectional view taken along line I-I' of FIG. 11 according to at least one example embodiment.

FIG. 11 is an enlarged perspective view of region A1 of FIG. 10, and FIG. 12 is a cross-sectional view taken along line I-I' of FIG. 11 according to at least one example embodiment.

Referring to FIGS. 11 and 12, the memory device 300 may include a peripheral circuit region P including a plurality of circuit devices 311A formed on a semiconductor substrate 310, and a cell region C including a plurality of memory cells 330 and 350. The cell region C includes a plurality of bit lines 340 extending in the first direction (e.g., the Y-axis direction, etc.) and a plurality of word lines 320 and 360 extending in a different direction than the plurality of bit lines 340, such as the second direction (e.g., the X-axis direction, etc.), but the example embodiments are not limited thereto.

For example, the cell region C may include lower word lines 320 below the bit lines 340 and upper word lines 360 above the bit lines 340 in the third direction (e.g., the Z-axis direction, etc.). Lower memory cells 330 may be between the bit lines 340 and the lower word lines 320, and upper memory cells 350 may be between the bit lines 340 and the upper word lines 360.

The circuit devices 311A may be adjacent to a device isolation layer 312A in at least one direction, such as the first direction and/or the second direction, and may be connected to circuit wires 314A through a device contact 313A. The circuit devices 311A may be covered by an interlayer insulating layer 315, but is not limited thereto. FIG. 11 may be an enlarged perspective view of the region A1 of FIG. 10, and the circuit devices 311A may provide a lower word line decoder connected to the lower word lines 320.

The lower word lines 320 may be connected to a heating electrode layer 321, etc. In the at least one example embodiment illustrated in FIG. 11, the heating electrode layer 321 is illustrated as being connected to a pair of lower memory cells 330 adjacent in the second direction, but the example embodiment is only provided by way of example and is not limited thereto. For example, each of the lower memory cells 330 may be connected to one heating electrode layer 321, etc. On the other hand, a recess 317 may be formed in a process of forming the heating electrode layer 321 and the lower word lines 320.

The heating electrode layers 321 may be separated from each other by a lower insulating pattern 322. An insulating spacer 323 and inner insulating layers 324 and 325 may be included in the heating electrode layer 321. The lower insulating pattern 322, the insulating spacer 323, and the inner insulating layers 324 and 325 may be formed of silicon oxide, silicon nitride, or the like.

Each of the lower memory cells 330 may include a variable resistance layer 331 contacting the heating electrode layer 321, a first electrode layer 332 and/or a selected device layer 334, etc., sequentially stacked on the variable resistance layer 331, a second electrode layer 336, and the like. According to some example embodiments, a first interface layer 333 and a second interface layer 335, etc., may be between the selected device layer 334 and the first electrode layer 332, and between the selected device layer 334 and the second electrode layer 336, respectively.

The variable resistance layer 331 may be formed of a material in which a phase change may occur by and/or based on heat transferred from the heating electrode layer 321. For example, the variable resistance layer 331 may include Ge—Sb—Te (GST), a chalcogenide material, but the example embodiments are not limited thereto. Additionally, the variable resistance layer 331 may be formed of a chalcogenide material including at least two elements selected from silicon (Si), germanium (Ge), antimony (Sb), tellurium (Te), bismuth (Bi), indium (In), tin (Sn), selenium (Se), etc., or any combinations thereof.

The selected device layer 334 may include a material in which resistance varies depending on the magnitude of a voltage applied across the selected device layer 334, and may include, for example, an Ovonic Threshold Switching (OTS) material, but is not limited thereto. The OTS material may include a chalcogenide switching material, etc. In at least one example embodiment, the selected device layer 334 may include Si, Te, As, Ge, In, or any combinations of these elements, or may further include nitrogen, etc. The material of the selected device layer 334 is not limited to the above description, and the selected device layer 334 may include various material layers capable of selecting a device.

The upper memory cells 350, a heating electrode layer 361, and the upper word lines 360 may be located on the bit lines 340. Referring to FIGS. 11 and 12, the heating electrode layer 361 may be connected to the upper word lines 360, and the heating electrode layers 361 may be separated from each other by the upper insulating pattern 362. An insulating spacer 363 and inner insulating layers 364 and 365 may be included in the heating electrode layer 361.

The upper memory cells 350 may have the same structure as that of the lower memory cells 330, but is not limited thereto. For example, each of the upper memory cells 350 may include a variable resistance layer 351 in contact with the heating electrode layer 361, a first electrode layer 352 and/or a selected device layer 354, etc., sequentially arranged (e.g., layered, stacked, etc.) below the variable resistance layer 351, a second electrode layer 356, and the like. Similarly to the case of the lower memory cells 330, a first interface layer 353 and a second interface layer 355 may be between the selected device layer 354 and the first electrode layer 352, and between the selected device layer 354 and the second electrode layer 356, respectively.

Figure 13:
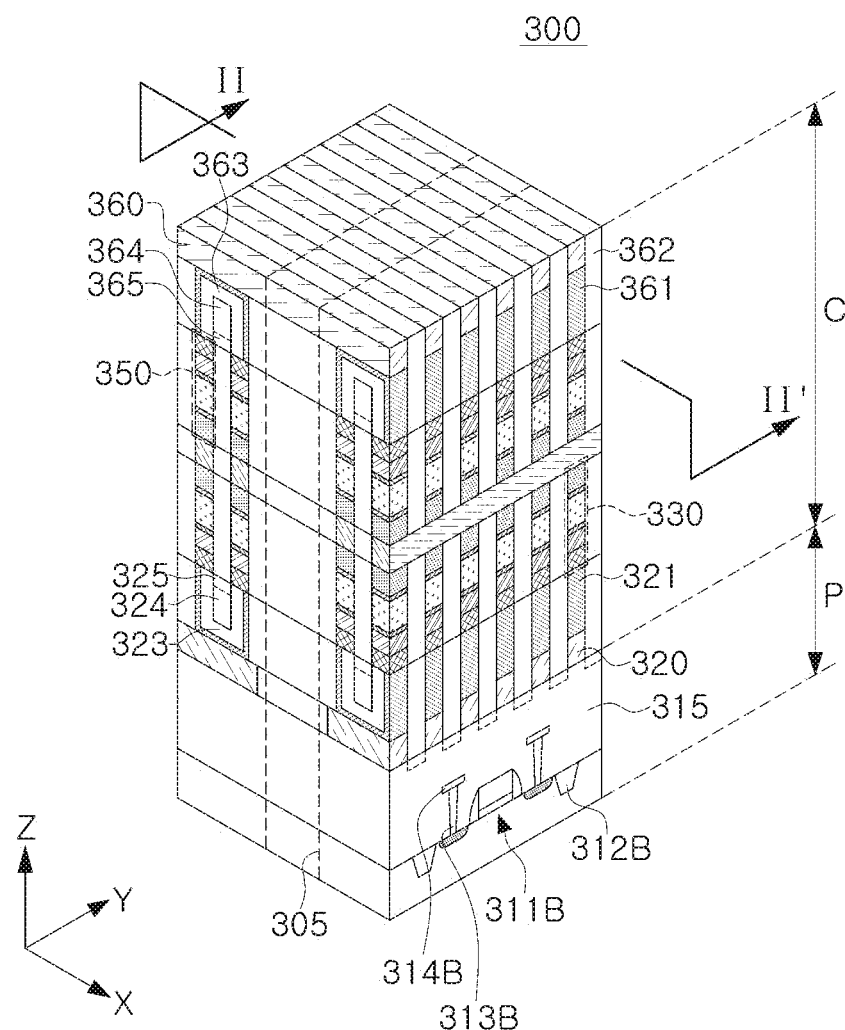
FIG. 13 is an enlarged perspective view of region B1 of FIG. 10 according to at least one example embodiment.
Figure 14:
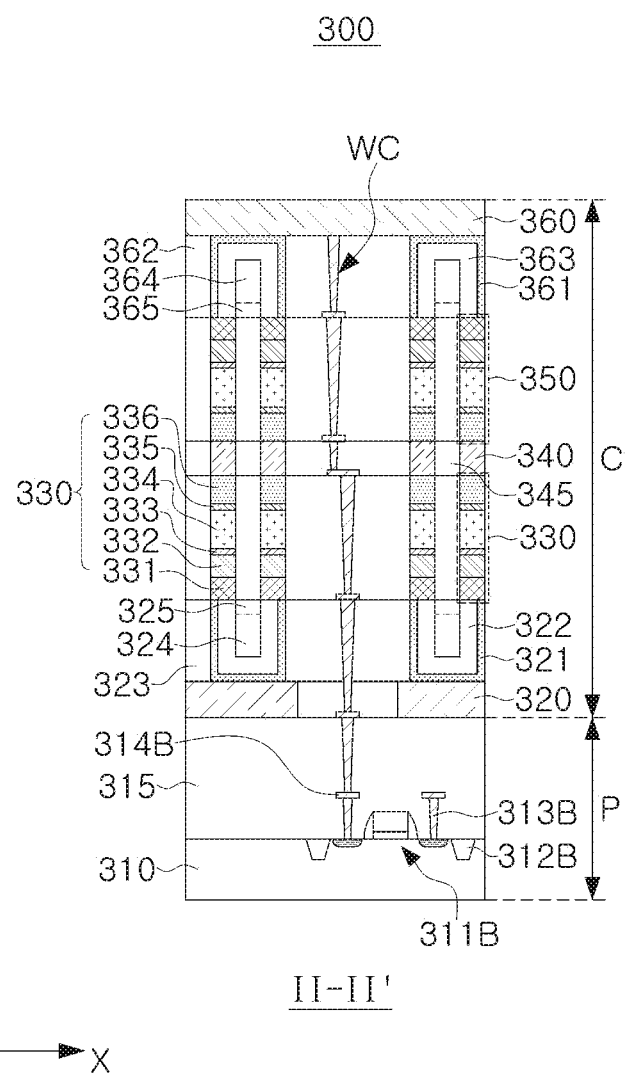
FIG. 14 is a cross-sectional view taken along line II-II' of FIG. 13 according to at least one example embodiment.

FIG. 13 is an enlarged perspective view of region B1 of FIG. 10, and FIG. 14 is a cross-sectional view taken along line I-I' of FIG. 13 according to some example embodiments.

The region B1 may be an area overlapping the word line contact region 305, but is not limited thereto. The word line contact region 305 may be an area in which word line contacts WC are connected to the upper word lines 360 and extend in, for example, the third direction. As described above with reference to FIGS. 8 and 10, the lower word lines 320 and the upper word lines 360 may be arranged in a zigzag manner in, for example, the second direction, but the example embodiments are not limited thereto. For example, the lower word lines 320 may be separated in, e.g., the second direction, in the word line contact region 305, and the upper word lines 360 may extend continuously in the word line contact region 305 and may be connected to word line contacts WC.

Referring to FIGS. 13 and 14, the bit lines 340, the lower word lines 320, and the memory cells 330 and 350 may not be included in the word line contact region 305. Therefore, the word line contacts WC connected to the upper word lines 360 in the word line contact region 305 may extend to the peripheral circuit region P. According to some example embodiments, the word line contacts WC may be divided into a plurality of layers in, e.g., the third direction, etc.

Circuit devices 311B connected to the word line contacts WC may provide an upper word line decoder for selecting at least one of the upper word lines 360. The upper word line decoder may be included in the upper word line decoder region 303 adjacent to the word line contact region 305 in, for example, the second direction, but is not limited thereto. Thus, the design of a metal line 314B and a device contact 313B for connecting the circuit devices 311B and the word line contacts WC may be simplified.

Figure 15:
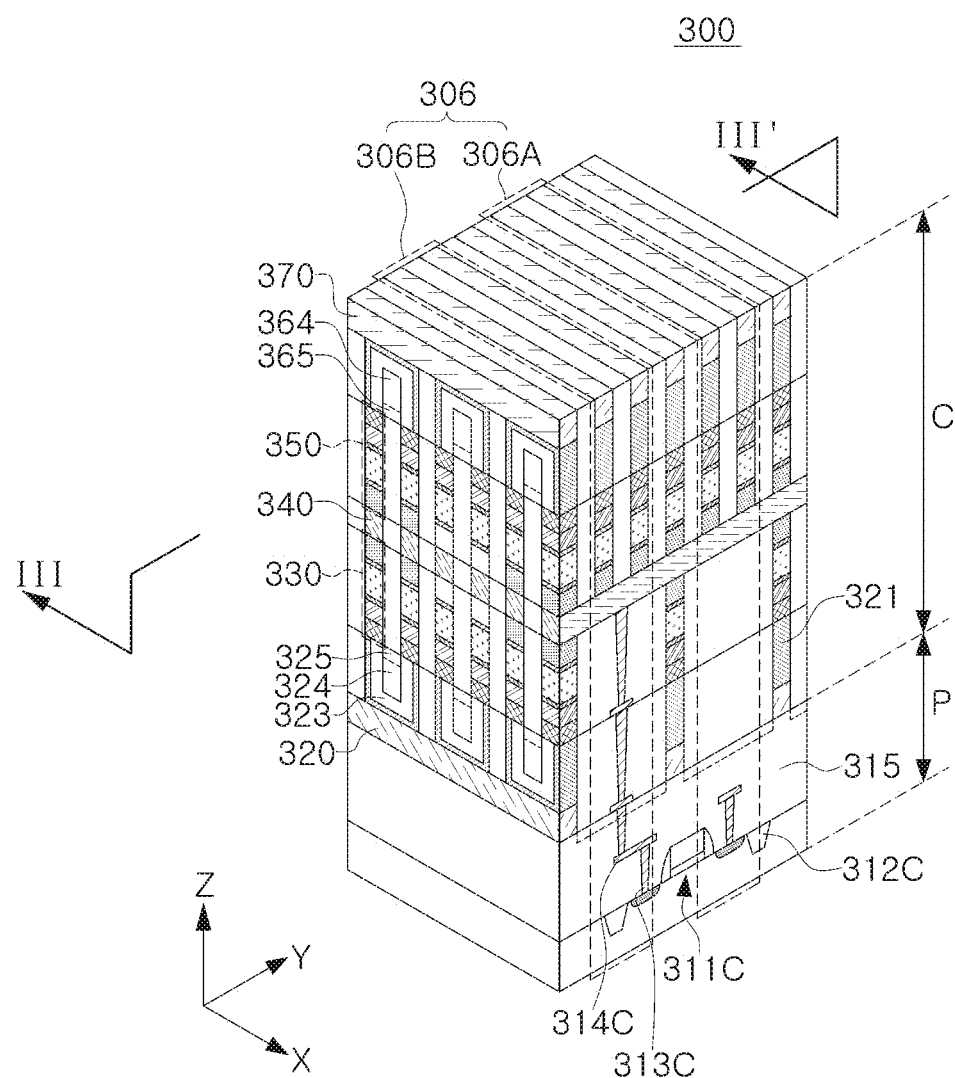
FIG. 15 is an enlarged perspective view of region C1 of FIG. 10 according to at least one example embodiment.
Figure 16:
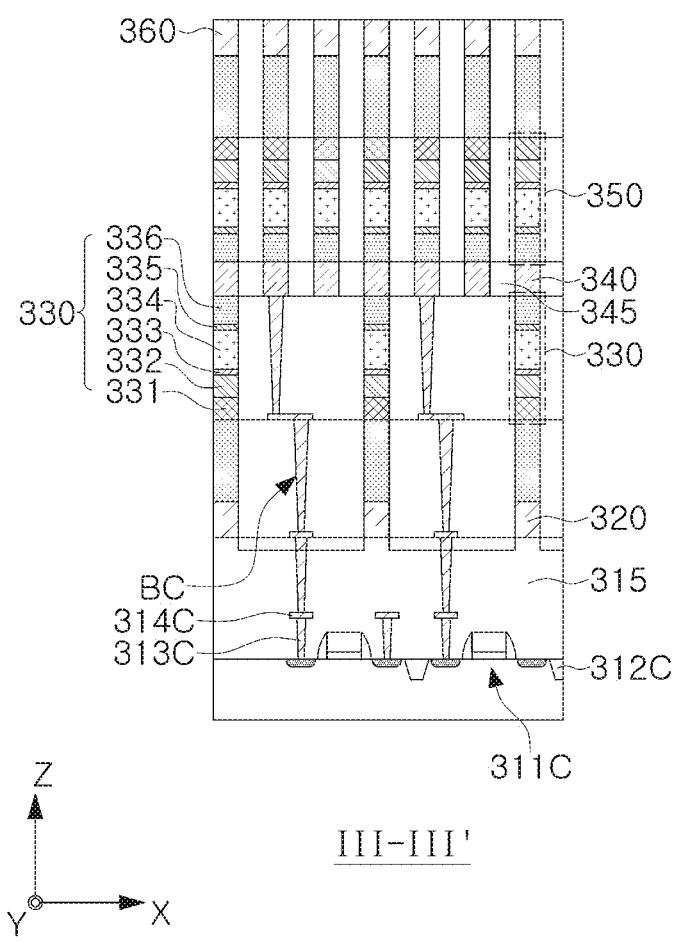
FIG. 16 is a cross-sectional view taken along line III-III' of FIG. 15 according to at least one example embodiment.

FIG. 15 is an enlarged perspective view of region C1 of FIG. 10. FIG. 16 is a cross-sectional view taken along line III-III' of FIG. 15 according to some example embodiments.

The region C1 may be an area overlapping the bit line contact regions 306. Bit line contact regions 306A and 306B (e.g., the bit line contact regions 306) may be respective regions extending in, for example, the second direction, and may be regions in which bit line contacts BC connected to the bit lines 340. To simplify the connection structure between the bit line contacts BC and the bit line decoder selecting at least one of the bit lines 340, the bit line contact regions 306 may be adjacent to the bit line decoder region 301 in a different direction, such as the first direction, etc.

According to at least one example embodiment, the upper memory cells 350 may be further included in at least one of the bit line contact regions 306. Referring to FIGS. 15 and 16, the lower memory cells 330 are not formed in the bit line contact regions 306 to secure a space in which the bit line contacts BC are arranged, whereas the upper memory cells 350 may be connected to upper portions of the bit lines 340. Thus, the degree of integration of the memory device 300 may be improved.

The upper memory cells 350 in each of the bit line contact regions 306 may be employed for various uses. For example, the upper memory cells 350 in the first bit line contact region 306A may be dummy memory cells. On the other hand, the upper memory cells 350 in the second bit line contact region 306B may operate like normal memory cells, or may be used for redundancy and/or testing purposes, etc. However, in some example embodiments, the upper memory cells 350 in the first bit line contact region 306A may also operate like the normal memory cells, or may also be used for redundancy and/or testing purposes, etc.

The bit line contacts BC may connect the bit lines 340 to circuit devices 311C. The circuit devices 311C may be separated from each other by a device isolation layer 312C, and may provide a bit line decoder. As described above, by arranging the bit line contact regions 306 to be adjacent to the bit line decoder region 301, the design difficulty and/or complexity of circuit wires 314c and a device contact 313C connecting the bit line contacts BC and the circuit devices 311C may be reduced, and therefore the manufacturing yield may increase and/or the manufacturing costs may be decreased.

Figure 17:
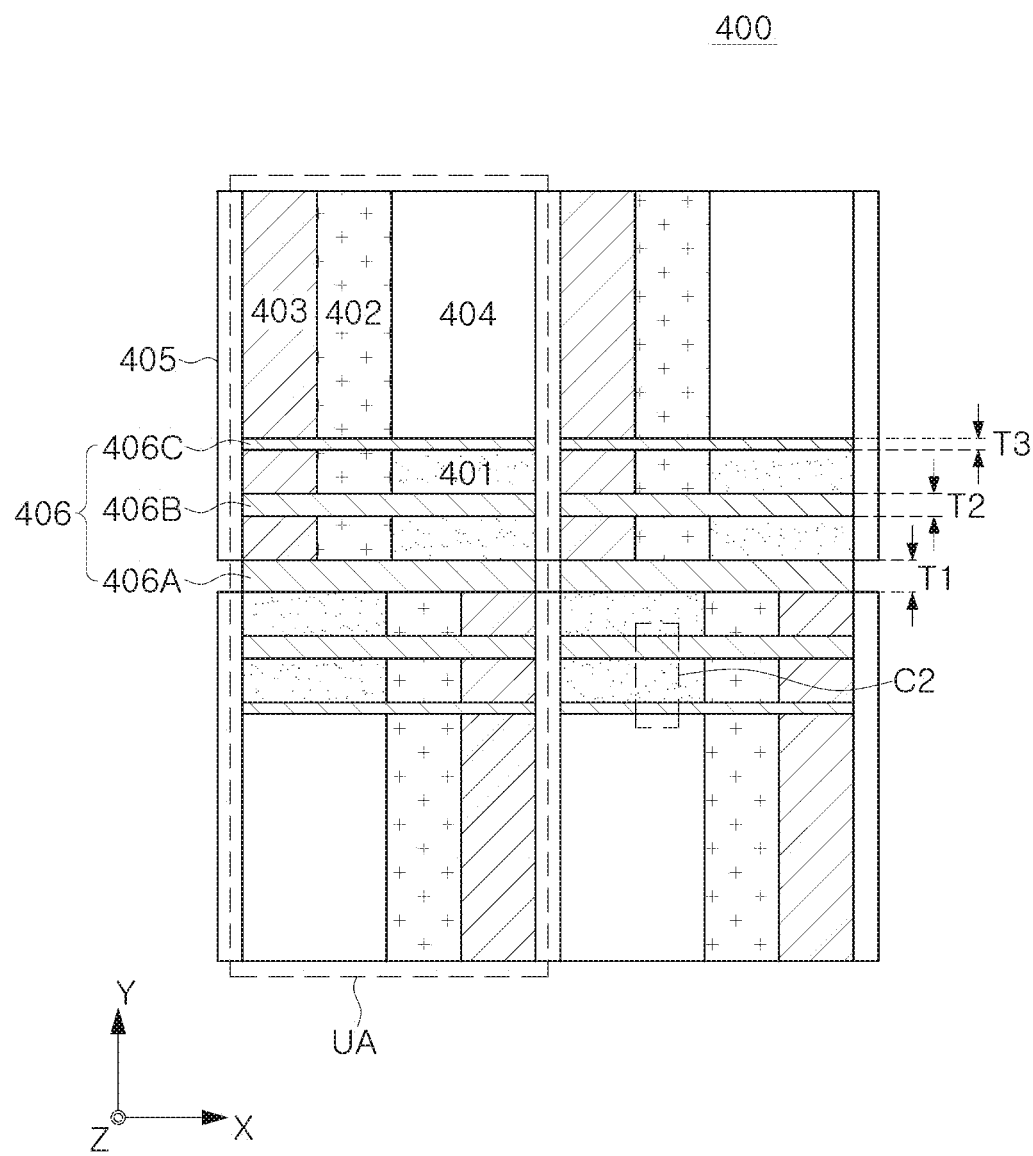
FIG. 17 is a diagram schematically illustrating a planar structure of a memory device according to at least one example embodiment.

FIG. 17 is a diagram schematically illustrating a planar structure of a memory device according to at least one example embodiment.

FIG. 17 may be a plan view illustrating a portion of a peripheral circuit region below memory cells in a memory device 400. Referring to FIG. 17, a peripheral circuit region may include unit areas UA arranged in a first direction (e.g., a Y-axis direction, etc.) and a second direction (e.g., an X-axis direction, etc.). Memory cells, bit lines, and word lines may be on the peripheral circuit region in a third direction (e.g., a Z-axis direction, etc.), but is not limited thereto.

The peripheral circuit region may include a bit line decoder region 401, word line decoder regions 402 and 403, a circuit region 404, a word line contact region 405, bit line contact regions 406A to 406C (e.g., bit line contact regions 406), and the like, but is not limited thereto. The arrangement and configuration of the bit line decoder region 401, the word line decoder regions 402 and 403, the circuit region 404, and the word line contact region 405 may be similar to those described with reference to FIG. 10, but is not limited thereto.

In at least one example embodiment illustrated in FIG. 17, a plurality of bit line contact regions 406 may be included in each of the unit areas UA. Accordingly, cell array regions in which the memory cells are located, and the bit line contact regions 406, may be alternately arranged, layered, stacked, etc., in each of the unit areas UA in, e.g., the first direction, etc.

The bit line contact regions 406 may include a first bit line contact region 406A that divides each of the unit areas UA into a first unit area and a second unit area, a second bit line contact region 406B, and/or a third bit line contact region 406C, etc. The bit line contact regions 406 may respectively extend in a different direction, such as the second direction, etc. According to some example embodiments, the third bit line contact region 406C may extend along a boundary of the bit line decoder region 401 in, for example, the second direction, etc.

In at least one example embodiment, the first to third bit line contact regions of each of the bit line contact regions 406 may have different widths, but are not limited thereto. For example, a width T2 of the second bit line contact region 406B may be greater than a width T3 of the third bit line contact region 406C, but is not limited thereto. A width T1 of the first bit line contact region 406A may be greater than or equal to the width of the second bit line contact region 406B. For example, the width T3 of the third bit line contact region 406C, which is closest to a boundary between a pair of the unit areas UA adjacent in the first direction, may be the smallest, but is not limited thereto. The respective widths of the first to third bit line contact regions of each of the bit line contact regions 406 may be determined based on and/or depending on the number of bit line contacts in the respective bit line contact regions 406.

As described above with reference to FIG. 9, the width of each of the bit lines BL may be less than the width of circuit wires connected to elements in the bit line bit line decoder region 401. The width may be a width defined in the second direction, but is not limited thereto. In at least one example embodiment, the width of each of the bit lines BL may be, for example, ½ or less of the width of each of the circuit wires, etc. Accordingly, the plurality of bit line contact regions 406 may include circuit wires connecting the respective bit lines BL to elements in the bit line decoder region 401.

For example, a case in which 8N bit lines (where N is a natural number) extend in the first direction and are arranged in the second direction in each of the unit areas UA may be provided by way of example. In this case, 4N bit lines on the left side may be connected to a bit line decoder included in the bit line decoder region 401 of the second unit area. In addition, 4N bit lines on the right side may be connected to a bit line decoder included in the bit line decoder region 401 of the first unit area.

First, N bit lines, among the 4N bit lines on the left side in each of the unit areas UA may be connected to N bit line contacts included in the third bit line contact region 406C. Also, N bit lines, among the remaining 3N bit lines may be connected to N bit line contacts included in the first bit line contact region 406A. Finally, the remaining 2N bit lines may be connected to 2N bit line contacts included in the second bit line contact region 406B.

Similarly, 2N bit lines, among the 4N bit lines on the right side in each of the unit areas UA may be connected to 2N bit line contacts in the second bit line contact region 406B. N bit lines, among the remaining 2N bit lines, may be connected to N bit line contacts in the first bit line contact region 406A. In addition, the remaining N bit lines may be connected to N bit lines in the third bit line contact region 406C.

In at least one example embodiment, the number of bit line contact regions 406 may be determined by Equation 1 below. In Equation 1 below, W1 may be the width of the bit lines and the interval between the bit lines, and W2 may be the width of the circuit wires connected to the bit lines and the interval between the circuit wires. In Equation 1, M may be a desired and/or minimum number of second and third bit line contact regions 406B and 406C in each of the unit areas UA. For example, the number of the second and third bit line contact regions 406B and 406C in each of the unit areas UA may be M or more.

$$(M-1)*W1 < W2 < M*W1 \quad \text{[Equation 1]}$$

For example, a case in which W1 is 30 μm and W2 is 100 μm may be provided by way of example, and in this case, M may be 4, but is not limited thereto. Therefore, as illustrated in FIG. 17, the number of second and third bit line contact regions 406B and 406C in each of the unit areas UA may be four or more, but is not limited thereto.

According to the at least one example embodiment illustrated in FIG. 17, in each of the unit areas UA, the number of bit line contacts in the third bit line contact region 406C may be less than the number of bit line contacts in each of the first bit line contact region 406A and the second bit line contact region 406B. Therefore, the width T3 of the third bit line contact region 406C may be relatively small. In at least one example embodiment, the width T3 of the third bit line contact region 406C may be equal to or less than ½ of the width of the second bit line contact region 406B, but is not limited thereto.

On the other hand, each of the bit line contact regions 406 may be adjacent to the bit line decoder region 401 and/or may have an area overlapping the bit line decoder region 401. Accordingly, the wiring design to connect the bit line contacts and the elements of the bit line decoder region 401 may be simplified, the performance of the memory device may be improved, and/or the memory device size may be reduced, etc.

Figure 18:
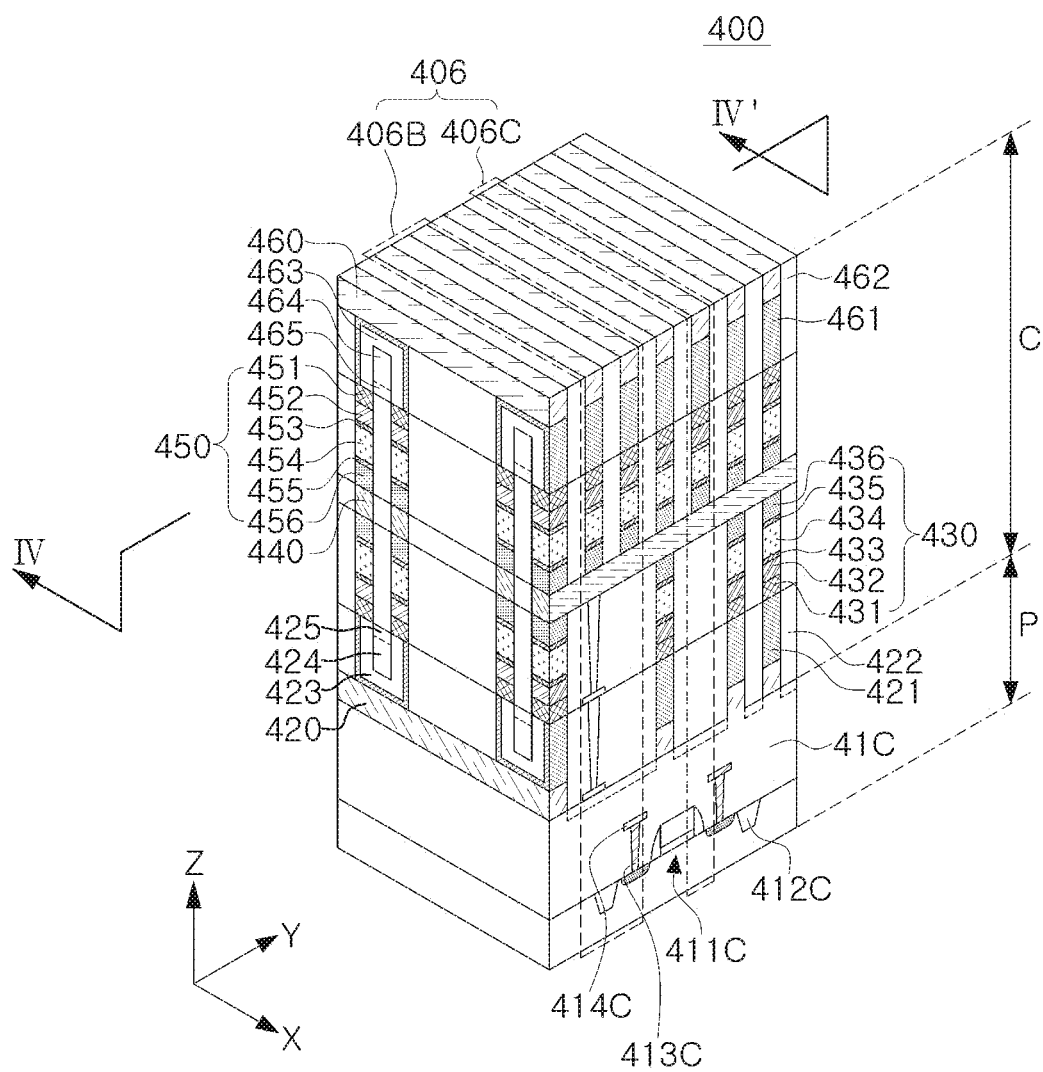
FIG. 18 is an enlarged perspective view of region C2 of FIG. 17 according to at least one example embodiment.
Figure 19:
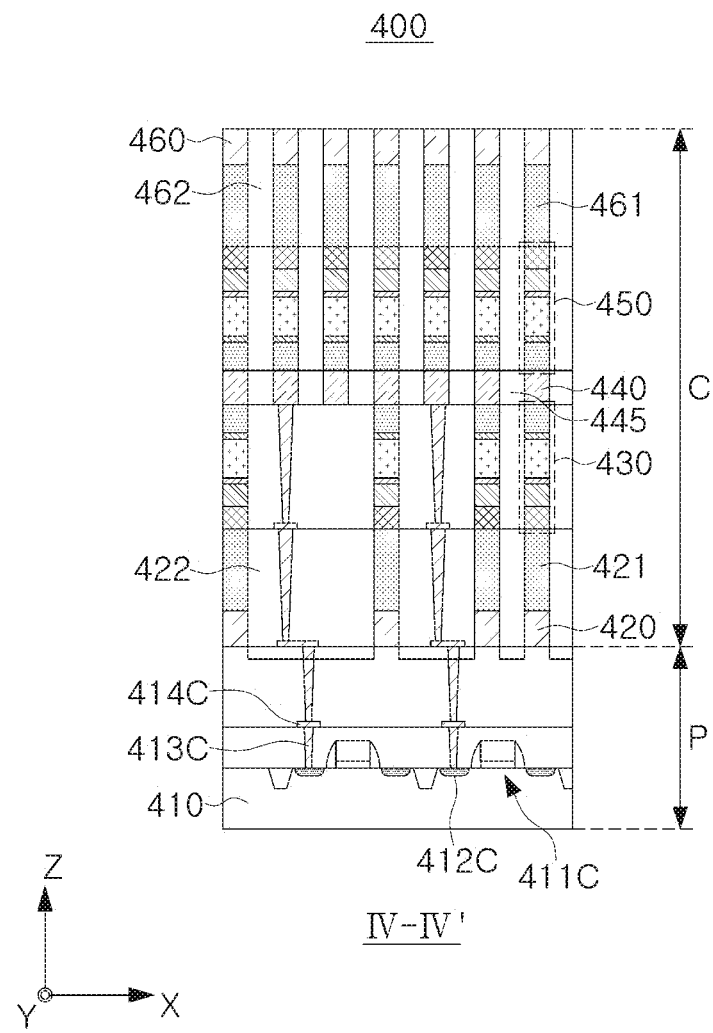
FIG. 19 is a cross-sectional view taken along line IV-IV' of FIG. 18 according to at least one example embodiment.

FIG. 18 is an enlarged perspective view of region C2 of FIG. 17, and FIG. 19 is a cross-sectional view taken along line IV-IV' of FIG. 18 according to at least one example embodiment.

Referring to FIGS. 18 and 19, the memory device 400 may include a peripheral circuit region P having a plurality of circuit devices 411C formed on a semiconductor substrate 410, and a cell region C having a plurality of memory cells 430 and 450, etc. The cell region C may include a plurality of bit lines 440 extending in the first direction (e.g., the Y-axis direction) and a plurality of word lines 420 and 460 extending in a different direction, e.g., the second direction (e.g., the X-axis direction, etc.). The word lines (420 and 460) may include lower word lines 420 below the bit lines 440, and upper word lines 460 above the bit lines 440.

The configuration of the cell region C and the peripheral circuit region P may be similar to the other example embodiments described above, but is not limited thereto. For example, the circuit devices 411C may be adjacent to a device isolation layer 412C in at least one of the first direction and the second direction, and may be connected to circuit wires 414C through a device contact 413C. Circuit devices 411A may be covered by an interlayer insulating layer 415.

The lower memory cells 430 and the upper memory cells 450 may share the bit lines 440. The lower memory cells 430 may be connected to the lower word lines 420 through a heating electrode layer 421. In some example embodiments with reference to FIGS. 18 and 19, the heating electrode layer 421 is illustrated as being connected to a pair of lower memory cells 430 adjacent in the second direction, but each of the lower memory cells 430 may also be connected to a single heating electrode layer 421, but are not limited thereto. In the process of forming the heating electrode layer 421 and the lower word lines 420, a recess 417 may be formed.

The heating electrode layers 421 may be separated from each other by a lower insulating pattern 422, and an insulating spacer 423 and inner insulating layers 424 and 425 may be included in the heating electrode layer 421. Each of the lower memory cells 430 may include a variable resistance layer 431 in contact with the heating electrode layer 421, a first electrode layer 432 and a selected device layer 434 sequentially stacked (e.g., arranged and/or layered, etc.) on the variable resistance layer 431, a second electrode layer 436, and the like. According to some example embodiments, a first interface layer 433 and a second interface layer 435 may be between the selected device layer 434 and the first electrode layer 432, and between the selected device layer 434 and the second electrode layer 436, respectively. A material included in the variable resistance layer 431 and the selected device layer 434 may be similar to that described above.

The variable resistance layer 331 may be formed of a material capable of causing a phase change based on and/or by heat transferred from the heating electrode layer 321. For example, the variable resistance layer 331 may include Ge—Sb—Te (GST), which is a chalcogenide material, but is not limited thereto. Additionally, the variable resistance layer 331 may be formed of a chalcogenide material including at least two elements selected from Si, Ge, Sb, Te, Bi, In, Sn, Se, etc., or any combinations thereof.

The upper memory cells 450, a heating electrode layer 461, and the upper word lines 460 may be on the bit lines 440. The upper word lines 460 may be connected to the upper memory cells 450 through the heating electrode layer 461, and the heating electrode layers 461 may be separated from each other by an upper insulating pattern 462, but are not limited thereto. An insulating spacer 463 and inner insulating layers 464 and 465 may be included in the heating electrode layer 461. The upper memory cells 450 may have the same structure as that of the lower memory cells 430, but is not limited thereto.

Referring to FIGS. 18 and 19, bit line contacts BC may be included in the second bit line contact region 406B and the third bit line contact region 406C. As described above with reference to FIG. 17, the second bit line contact region 406B and the third bit line contact region 406C may have different widths, but is not limited thereto.

The lower memory cells 430 may not be included in each of the second bit line contact region 406B and the third bit line contact region 406C, and only the upper memory cells 450 may be included in each of the second bit line contact region 406B and the third bit line contact region 406C. The upper memory cells 450 included in the second bit line contact region 406B and the third bit line contact region 406C may operate as general memory cells storing data, and/or may be used for redundancy or testing purposes, etc.

For example, when the second bit line contact region 406B and the third bit line contact region 406C have different widths, the numbers of upper memory cells 450 in the second bit line contact region 406B and the third bit line contact region 406C may be different. For example, the number of upper memory cells 450 in the second bit line contact region 406B may be greater than the number of upper memory cells 450 in the third bit line contact region 406C, but is not limited thereto. In addition, the number of upper word lines 460 in the second bit line contact region 406B may be greater than the number of upper word lines 460 in the third bit line contact region 406C, but is not limited thereto.

Although not illustrated in FIGS. 18 and 19, only the upper memory cells 450 may also be included in the first bit line contact region 406A. The upper memory cells 450 in the first bit line contact region 406A may be operated as general memory cells, utilized for redundancy and/or testing purposes, and/or allocated to dummy memory cells, etc.

Figure 20:
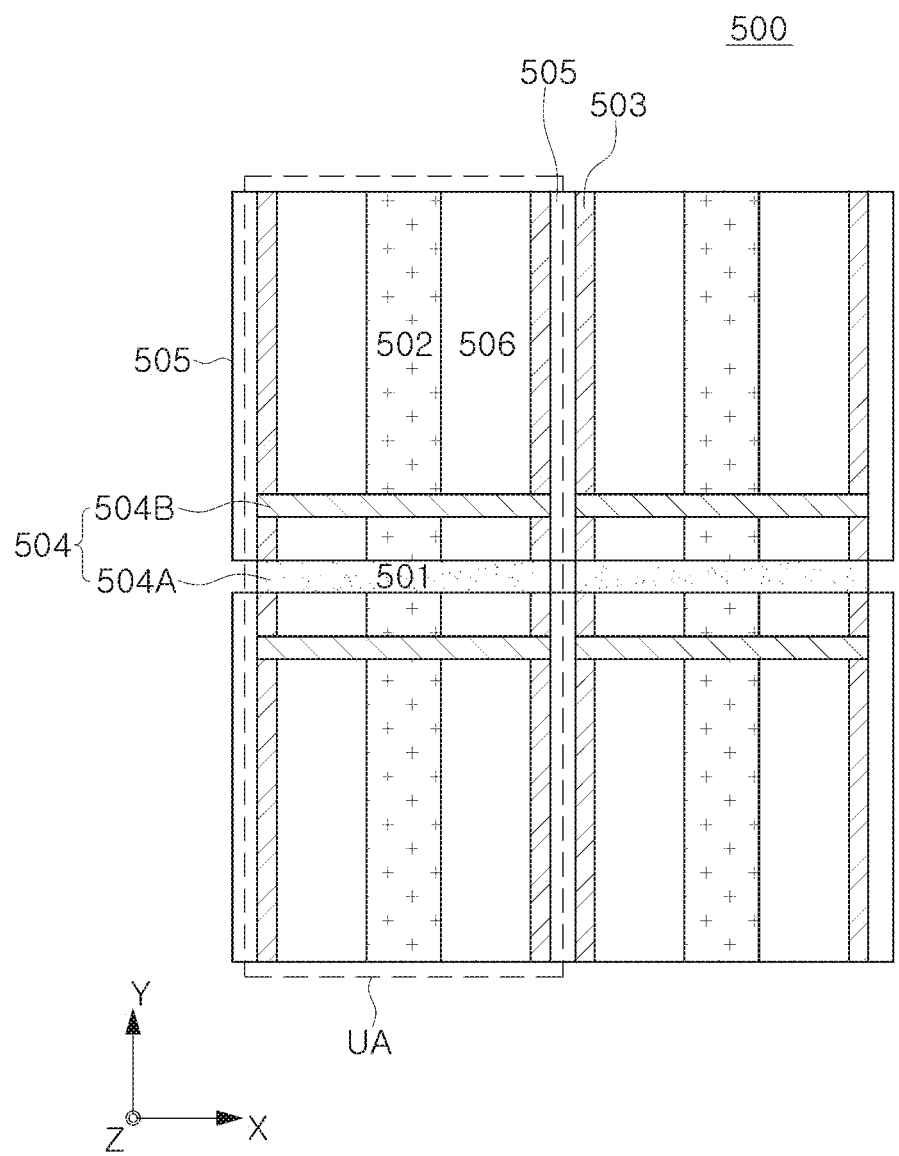
FIGS. 20 and 21 are diagrams schematically illustrating planar structures of memory devices according to some example embodiments.
Figure 21:
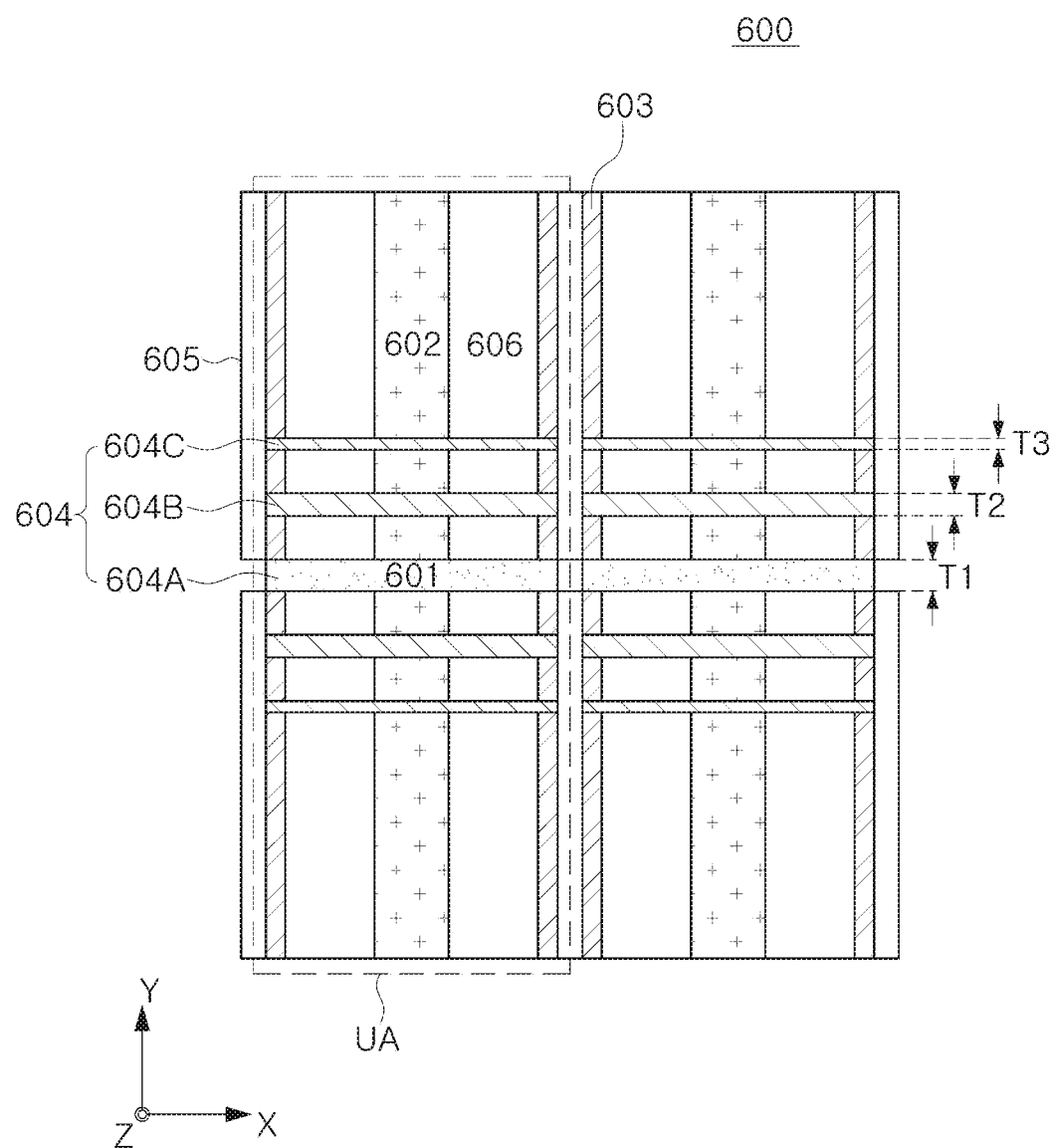

FIGS. 20 and 21 are diagrams schematically illustrating planar structures of memory devices according to some example embodiments.

FIGS. 20 and 21 may be plan views illustrating a portion of a peripheral circuit region below memory cells in each of memory devices 500 and 600. Referring to FIGS. 20 and 21, a peripheral circuit region may include unit areas UA arranged in a first direction (e.g., a Y-axis direction, etc.) and a second direction (e.g., an X-axis direction, etc.). Memory cells, bit lines, and word lines may be on the peripheral circuit region in a third direction (e.g., a Z-axis direction). The peripheral circuit regions may include bit line decoder regions 501 and 601, word line decoder regions 502, 503, 602 and 603, bit line contact regions 504 and 604, word line contact regions 505 and 605, circuit regions 506 and 606, and the like, respectively.

Bit line decoders may be included in the bit line decoder regions 501 and 601, and a lower word line decoder and an upper word line decoder may be included in the word line decoder regions 502, 503, 602 and 603, respectively. Circuits connected to at least one of the bit line decoder, the lower word line decoder, and the upper word line decoder may be included in the circuit region 506 or 606. For example, a precharge circuit, a sense amplifier, and the like may be in the circuit region 506 or 606.

In the some example embodiments illustrated FIGS. 20 and 21, the lower word line decoder region 502 or 602 may be included in the center (or approximately the center) of each of the unit areas UA in the second direction. The upper word line decoder region 503 or 603 may be adjacent to a boundary of each of the unit areas UA. Bit lines and memory cells may not be in an area connecting the upper word lines and the upper word line decoder. Therefore, the upper word line decoder may be adjacent to a boundary between the bit lines and the unit areas UA in which the memory cells are not located.

In the some example embodiments illustrated in FIGS. 20 and 21, the lower word lines may be separated in the second direction at the boundary between the unit areas UA, and the upper word lines may be separated in the second direction in the center inside the unit areas UA, etc. In an example, the upper word lines may be separated in the second direction on the lower word line decoder region 502 or 602. Accordingly, the lower word line contacts may be connected adjacently to the center of the lower word lines, the upper word line contacts may also be connected adjacently to the center of the upper word lines, and skew between the memory cells may be significantly reduced, and therefore performance of the memory cells may be improved.

In the memory device 500 according to the at least one example embodiment illustrated in FIG. 20, each of the unit areas UA may include a plurality of bit line contact regions 504A through 504B. First bit line contact region 504A may be an area overlapping an upper portion of the bit line decoder region 501 in which the bit line decoder is formed, but is not limited thereto. The second bit line contact region 504B may be an area separated from the bit line decoder region 501 in the first direction, but may be within a desired and/or predetermined range from the bit line decoder region 501 to simplify the circuit wiring design, and therefore reduce the complexity of the memory device, improve the manufacturing yield of the memory device, and/or reduce the manufacturing cost of the memory device, etc.

In the memory device 600 according to the at least one example embodiment illustrated in FIG. 21, each of the unit areas UA may include a plurality of bit line contact regions 604A through 604C. The first bit line contact region 604A may be an area overlapping an upper portion of the bit line decoder region 601 in which the bit line decoder is formed, but is not limited thereto. The second bit line contact region 604B and the third bit line contact region 604C may be areas separated from the bit line decoder region 601 in the first direction, but may be within a desired and/or predetermined range from the bit line decoder region 601 to simplify the circuit wiring design, and therefore reduce the complexity of the memory device, improve the manufacturing yield of the memory device, and/or reduce the manufacturing cost of the memory device, etc.

In the at least one example embodiment illustrated in FIG. 21, widths of the bit line contact regions 604 may be different, but are not limited thereto. For example, a width T3 of third bit line contact region 604C farthest from the bit line decoder region 601 in the first direction may be less than a width T1 or T2 of each of the other bit line contact regions 604A and 604B. Respective widths of the bit line contact regions 604 may be determined depending on the number of bit line contacts in each of the bit line contact regions 604.

Figure 22:
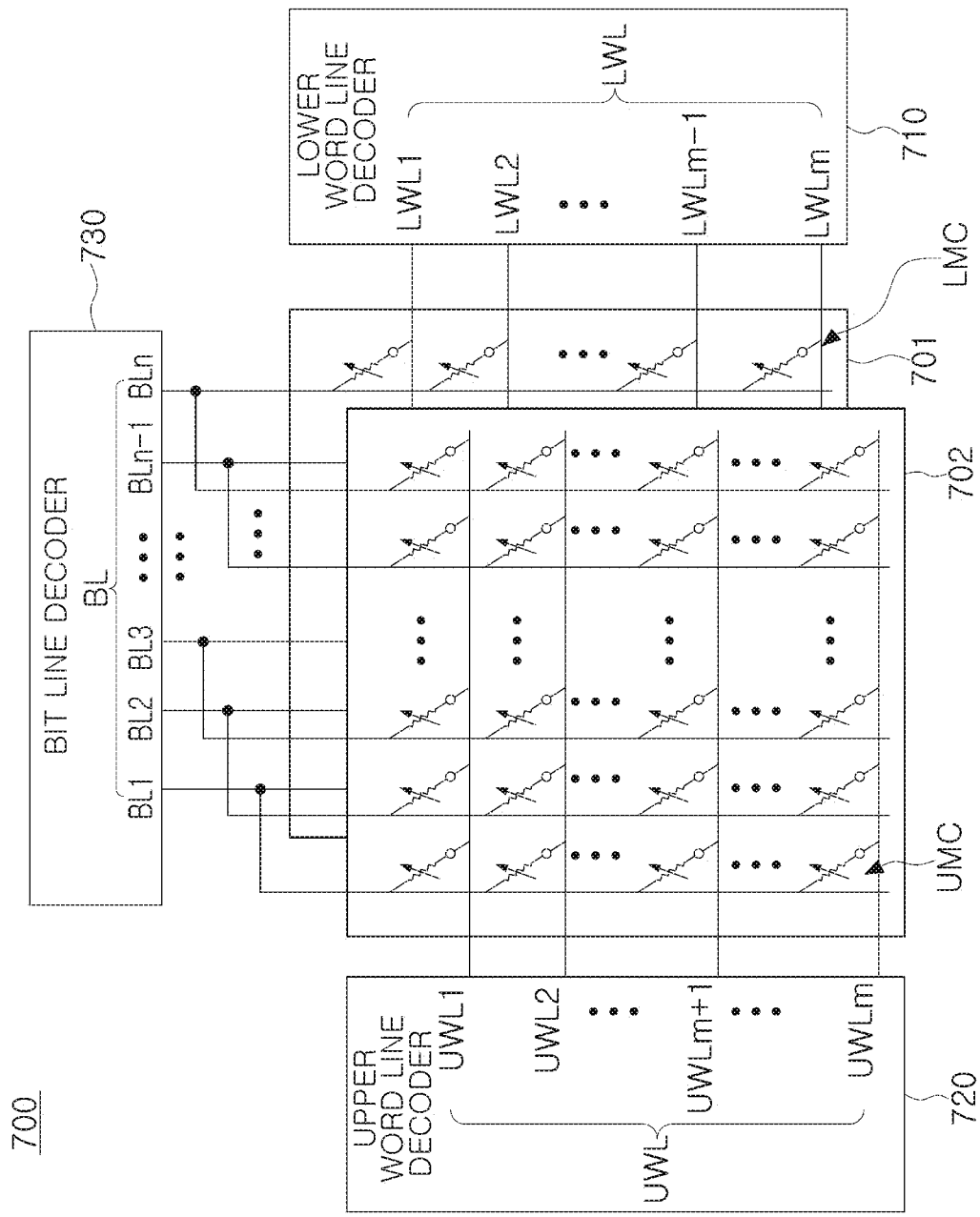
FIGS. 22 and 23 are diagrams illustrating operations of memory devices according to some example embodiments.
Figure 23:
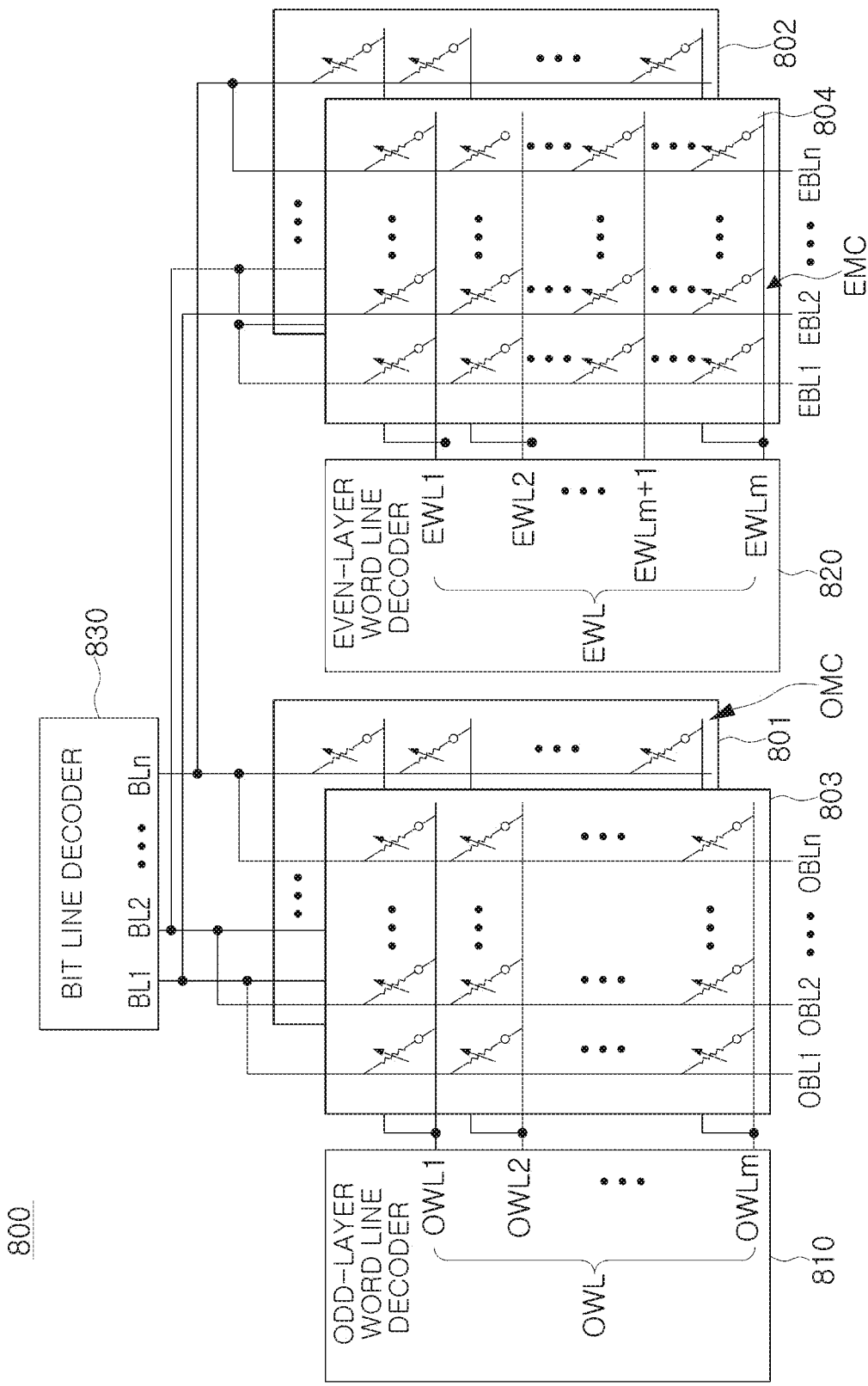

FIGS. 22 and 23 are diagrams illustrating operations of memory devices according to some example embodiments.

First, referring to FIG. 22, a memory device 700 according to at least one example embodiment may include a plurality of memory layers, such as memory layers 701 and 702, etc., and the plurality of memory layers (701 and 702) may include a first memory layer 701 and a second memory layer 702, etc. Lower memory cells LMC included in the first memory layer 701 may be connected to lower word lines LWL, and upper memory cells UMC included in the second memory layer 702 may be connected to upper word lines UWL.

The upper memory cells UMC and the lower memory cells LMC may share the bit lines BL. For example, the upper memory cells UMC may be connected to upper portions (e.g., a first subset) of the bit lines BL, respectively, and the lower memory cells LMC may be connected to lower portions (e.g., a second subset) of the bit lines BL, respectively. Regardless of the sharing of the bit lines BL, the upper memory cells UMC and the lower memory cells LMC may be independently controlled, and/or controlled together. For example, when a bit line decoder 730 selects a first bit line BL1 and an upper word line decoder 720 selects a first upper word line UWL1, the lower word line decoder 710 may not select a first lower word line LWL1. Therefore, the upper memory cell UMC connected between the first bit line BL1 and the first upper word line UWL1 may be controlled.

In the at least one example embodiment illustrated in FIG. 22, the number of upper word lines UWL may be greater than the number of lower word lines LWL, and thus, the number of upper memory cells UMC may be greater than the number of lower memory cells LMC. Referring to FIG. 22, the number of lower word lines LWL may be m, whereas the number of upper word lines UWL may be greater than m, the number of lower word lines. For example, an upper word line UWLm+1 additionally included in the second memory layer 702 may be included in the bit line contact region in which the bit lines BL and the bit line contacts are connected. For example, only upper memory cells UMC may be included in the bit line contact region, but the example embodiments are not limited thereto.

Referring next to FIG. 23, a memory device 800 according to at least one example embodiment may include a plurality of memory layers 801 to 804. The plurality of memory layers (such as memory layers 801 to 804, etc.) may include a first memory layer 801, a second memory layer 802, a third memory layer 803, and/or a fourth memory layer 804, etc., sequentially stacked (e.g., arranged, layered, etc.). In at least one example embodiment, odd-layer memory cells OMC included in the first memory layer 801 and the third memory layer 803 may be connected to an odd-layer word line decoder 810 through odd-layer word lines OWL, etc. Even-layer memory cells EMC included in the second memory layer 802 and the fourth memory layer 804 may be connected to an even-layer word line decoder 820 through even-layer word lines EWL, etc. On the other hand, in some example embodiments, the memory layers 801 to 804 may also be connected to different word line decoders, respectively.

In the at least one example embodiment illustrated in FIG. 23, the bit lines BL may be shared by the odd-layer memory cells OMC and the even-layer memory cells EMC. The bit lines BL may include lower bit lines between the first memory layer 801 and the second memory layer 802, and upper bit lines between the third memory layer 803 and the fourth memory layer 804, etc. For example, the lower bit line and the upper bit line in the same position on a plane perpendicular to a stacking direction of the memory layers 801 to 804, and may be electrically connected to each other. Therefore, when one of the bit lines BL is selected by the bit line decoder 830, the lower bit line and the upper bit line may be simultaneously selected. However, according to some example embodiments, the lower bit lines and the upper bit lines may be electrically separated from each other, and may be individually selected by different bit line decoders.

In the at least one example embodiment illustrated in FIG. 23, the fourth memory layer 804 located on an uppermost layer may include a larger number of word lines than those of the other memory layers 801 to 803, but are not limited thereto. Referring to FIG. 23, each of the first to third memory layers 801 to 803 includes m word lines, whereas the fourth memory layer 804 may include a larger number of word lines, but are not limited thereto. For example, a word line EWLm+1 additionally included in the fourth memory layer 804 may be included in the bit line contact region in which the bit lines BL and the bit line contacts are connected. For example, in the bit line contact region, memory cells and at least one-word line connected to the memory cells may be added to the uppermost layer, but are not limited thereto.

Figure 24:
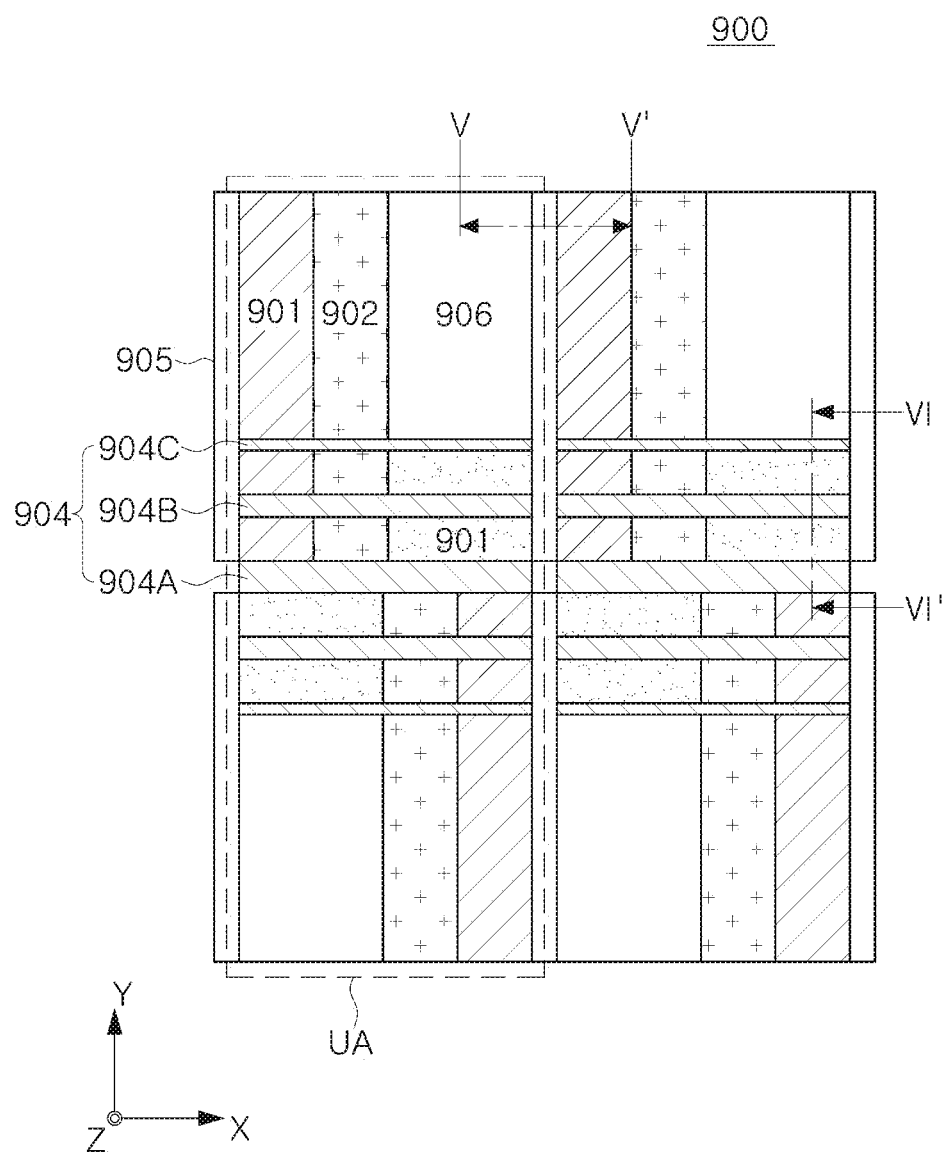
FIG. 24 is a diagram schematically illustrating a planar structure of a memory device according to at least one example embodiment.
Figure 25:
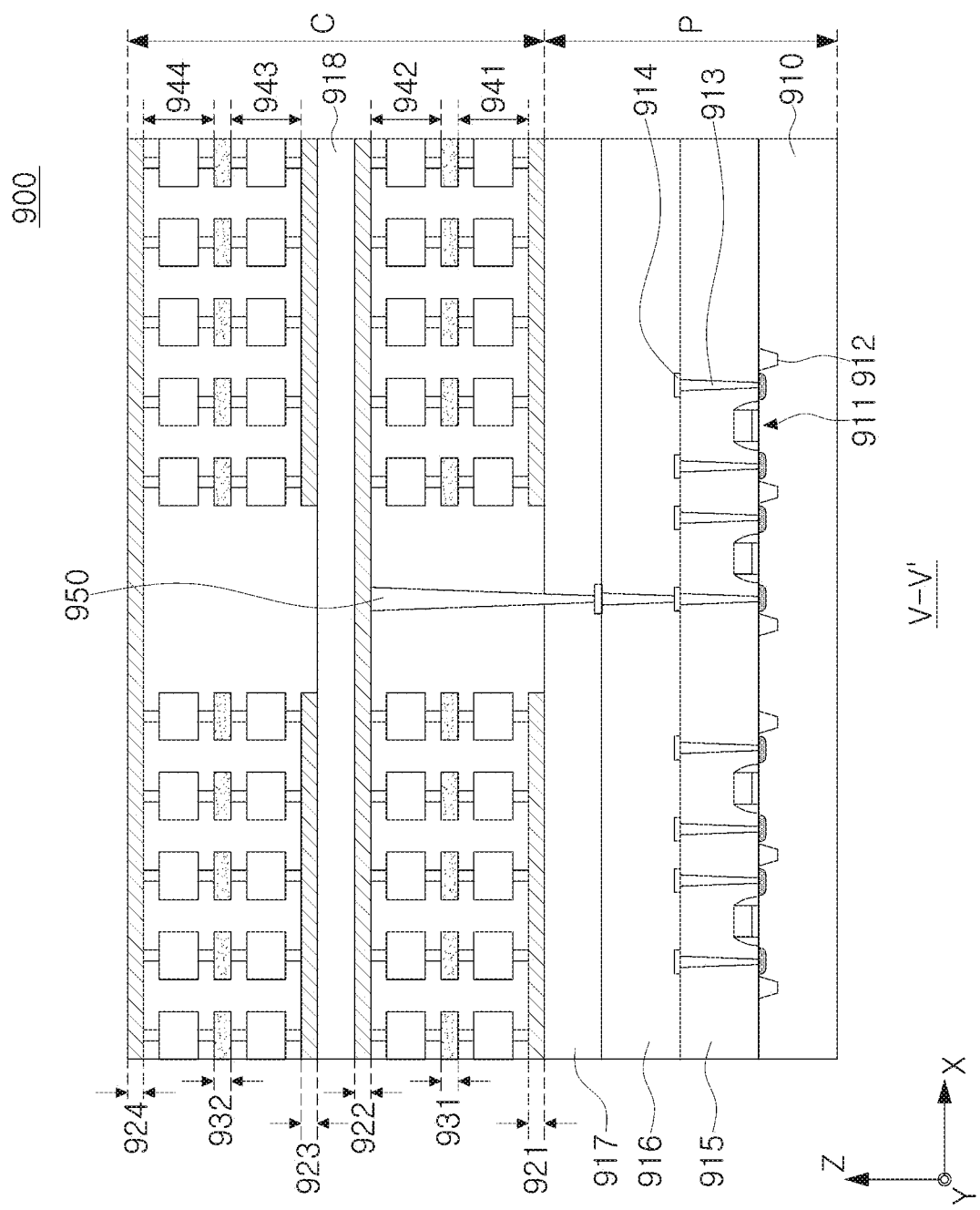
FIG. 25 is a cross-sectional view taken along line V-V' of FIG. 24 according to at least one example embodiment.
Figure 26:
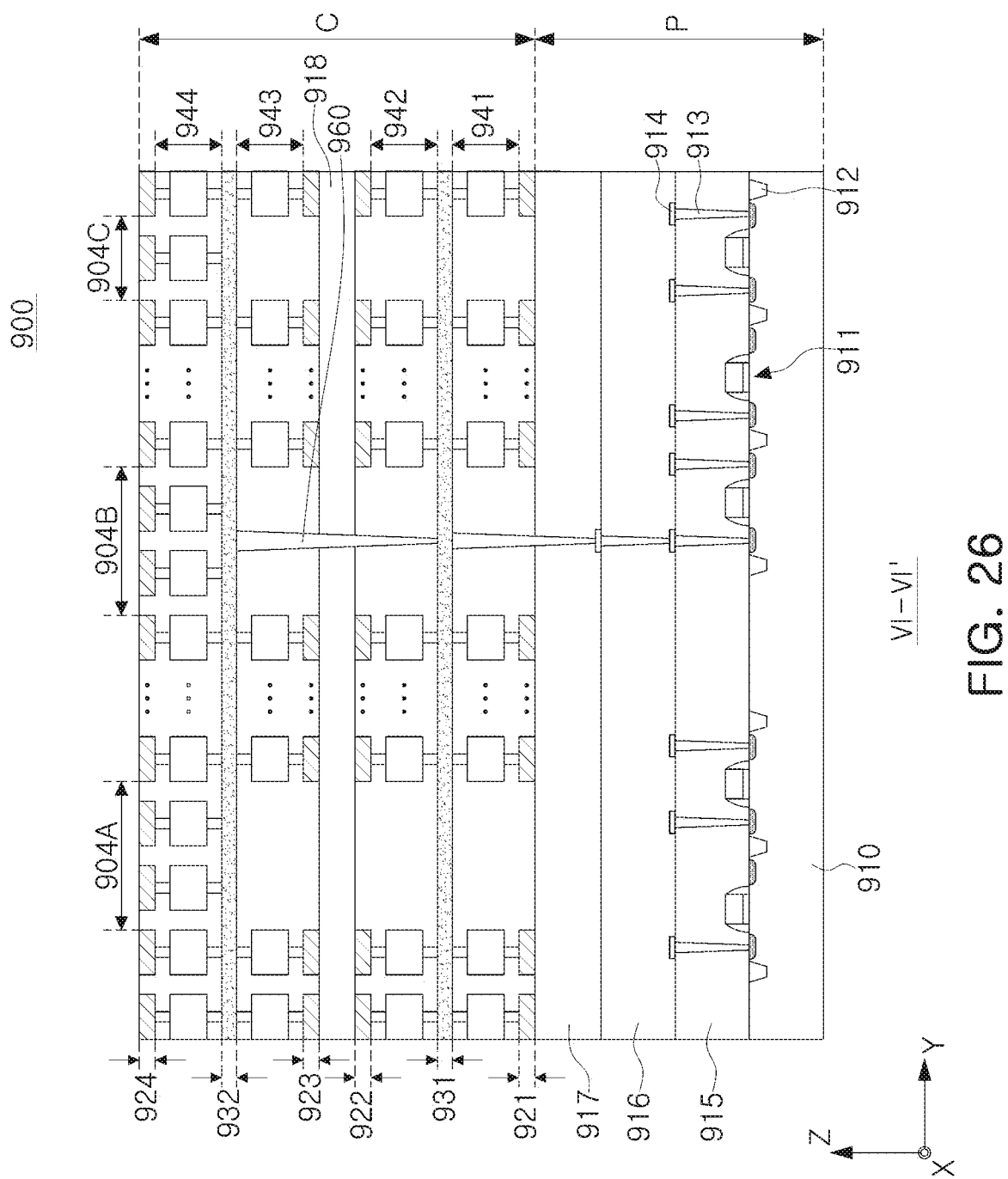
FIG. 26 is a cross-sectional view taken along line VI-VI' of FIG. 24 according to at least one example embodiment.

FIG. 24 is a cross-sectional view schematically illustrating a planar structure of a memory device according to at least one example embodiment, FIG. 25 is a cross-sectional view taken along line V-V' of FIG. 24, and FIG. 26 is a cross-sectional view taken along line VI-VI' of FIG. 24 according to some example embodiments.

First, referring to FIG. 24, FIG. 24 may be a plan view illustrating a portion of a peripheral circuit region below memory cells in a memory device 900. The peripheral circuit region may include unit areas UA arranged in a first direction (e.g., a Y-axis direction) and a second direction (e.g., an X-axis direction). The peripheral circuit region may include a bit line decoder region 901, word line decoder regions 902 and 903, a circuit region 904, a word line contact region 905, bit line contact regions 906A to 906C (e.g., bit line contact regions 906), and the like, but are not limited thereto. The arrangement and configuration of the regions may be similar to those described above with reference to FIG. 17, but are not limited thereto.

The memory device 900 may include memory cells and bit lines above the peripheral circuit region in a third direction (e.g., a Z-axis direction, etc.), and word lines, and the like. Referring to FIGS. 25 and 26 together illustrating a peripheral circuit region P and a cell region C on the peripheral circuit region P, the memory device 900 may include a plurality of memory layers, e.g., memory layers 941 to 944, etc., stacked in the third direction.

Referring to FIGS. 25 and 26, a plurality of circuit devices 911 may be formed in the peripheral circuit region P. The circuit devices 911 may be separated from each other by a device isolation layer 912. The circuit devices 911 may be connected to the circuit wires 914 through device contacts 913. The circuit devices 911, the device contacts 913, and the circuit wires 914 may be covered by a plurality of interlayer insulating layers, such as interlayer insulating layers 915 to 917, etc.

The cell region C includes a plurality of memory layers, such as first to fourth memory layers 941 to 944, etc., stacked in the third direction, and each of the memory layers, e.g., first to fourth memory layers 941 to 944, includes a plurality of memory cells. The memory cells may be arranged in the first direction and the second direction in each of the memory layers, e.g., memory layers 941 to 944.

Word lines 921 to 924 and bit lines 931 and 932 may be between the memory layers 941 to 944. For example, first layer word lines 921 may be between first memory layer 941 and the peripheral circuit region P, but is not limited thereto. The lower bit lines 931 may be between the first memory layer 941 and second memory layer 942. Thus, memory cells in the respective memory layers 941 to 944 may be connected to the word lines 921 to 924 and the bit lines 931 and 932, etc.

Referring to FIG. 25, second layer word lines 922 on the second memory layer 942 may be connected to the circuit devices 911 through a word line contact 950 in the word line contact region 905. As an example, the circuit devices 911 connected to the word line contact 950 may be included in a word line decoder for selecting at least one of the memory cells in the second memory layer 942.

Referring to FIG. 26, the memory device 900 may include a plurality of bit line contact regions, e.g., bit line contact regions 904A to 904C, etc., and the bit line contact regions 904A to 904C may be separated from each other in the first direction. Each of the bit lines 931 and 932 may be connected to a bit line contact 960 in at least one of the bit line contact regions 904A to 904C. In the at least one example embodiment illustrated in FIG. 26, the bit line contact 960 may be commonly connected to the lower bit line 931 and the upper bit line 932 in the same position in the second direction, but are not limited thereto.

As illustrated in FIG. 24, the bit line contact regions 904A to 904C may be adjacent to the bit line decoder region 901 in the first direction or may be within the bit line decoder region 901 in the first direction. Therefore, in the example embodiment illustrated in FIG. 26, the circuit devices 911 connected to the bit lines 931 and 932 by the bit line contact 960 may be elements included in the bit line decoder.

The bit line contact regions 904A to 904C may have different widths in the first direction and/or the same widths, etc. Referring to FIGS. 24 and 26, third bit line contact region 904C adjacent to a boundary of the bit line decoder region 901 may have a smaller width than that of the first bit line contact region 904A and the second bit line contact region 904B, but are not limited thereto. Accordingly, a relatively small number of bit line contacts 960 may be included in the third bit line contact region 904C. For example, the width of the third bit line contact region 904C may be less than or equal to ½ of the width of each of the first bit line contact region 904A and the second bit line contact region 904B, but is not limited thereto.

Referring to FIGS. 25 and 26, in the bit line contact regions 904A through 904C, memory cells may be only in the fourth memory layer 944 positioned on an uppermost layer in the third direction, but is not limited thereto. For example, the memory cells may not be included in the respective first to third memory layers 941 to 943, whereas the memory cells may be included in the fourth memory layer 944, in the bit line contact regions 904A to 904C. Accordingly, the fourth memory layer 944 located on the uppermost layer may include more memory cells and word lines than those of each of the first to third memory layers 941 to 943, but is not limited thereto.

Figure 27:
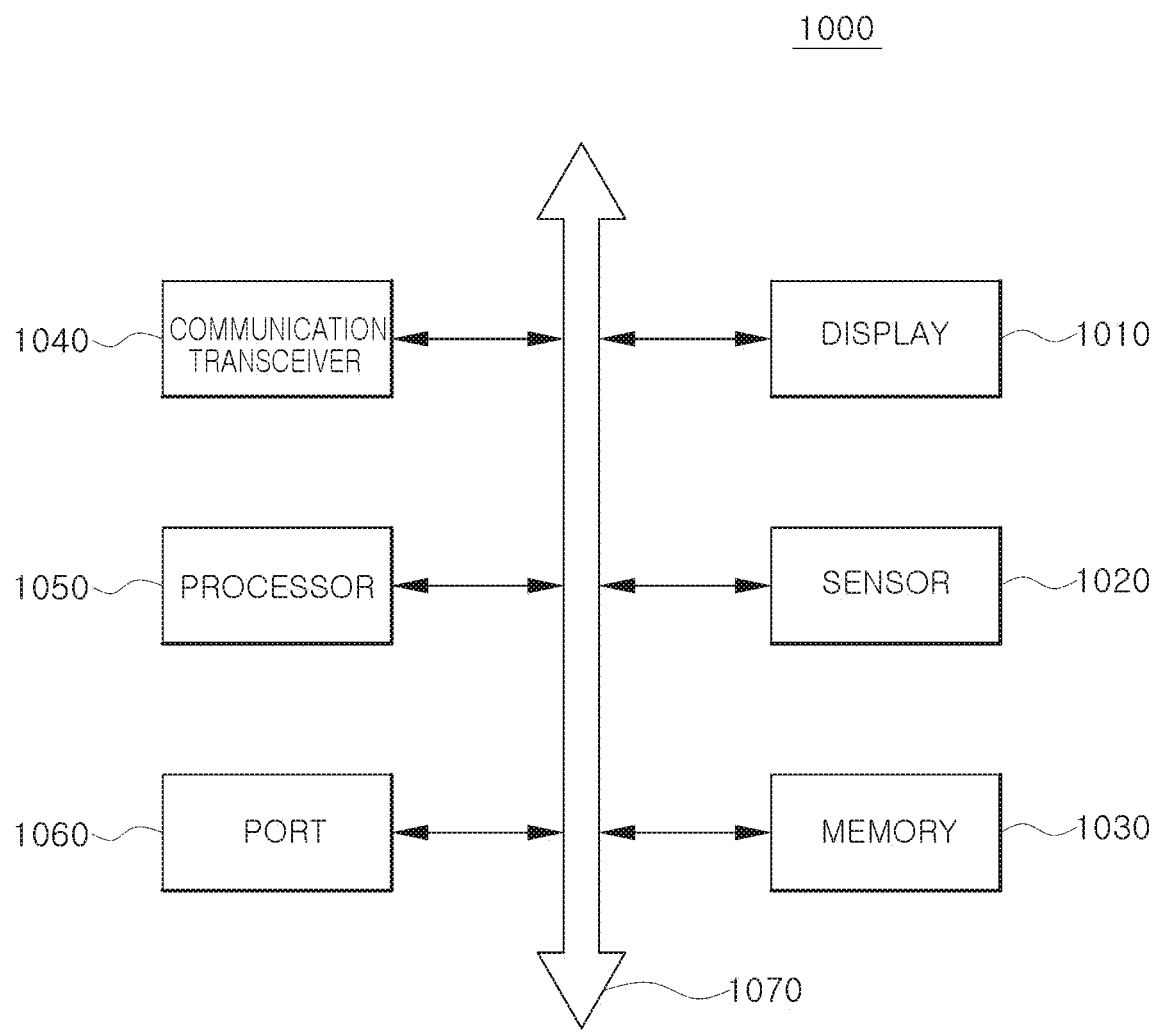
FIG. 27 is a block diagram schematically illustrating an electronic device including a memory device according to at least one example embodiment.

FIG. 27 is a block diagram schematically illustrating an electronic device including a memory device according to at least one example embodiment.

An electronic device 1000 according to at least one example embodiment illustrated in FIG. 27 may include a display 1010, at least one sensor 1020, a memory 1030, at least one communication transceiver 1040, processing circuitry including, for example, at least one processor 1050, a port 1060, and the like, but is not limited thereto. In addition, the electronic device 1000 may further include a power supply device, an input/output device and the like. Among the components illustrated in FIG. 27, the port 1060 may be a device provided for the electronic device 1000 to communicate with a video card, a sound card, a memory card, a USB device, and the like. The electronic device 1000 may include not only a general desktop computer or a laptop computer but also a smartphone, a tablet PC, a smart wearable device, an Internet of Things (IoT) device, an autonomous vehicle, a robotic device, a virtual reality and/or augmented reality device, a gaming device, and the like.

The processor 1050 may perform a specific operation, an instruction, a task, or the like. The processor 1050 may include hardware including logic circuits; a hardware/software combination such as at least one processor executing software; or a combination thereof. For example, the memory controller more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processor 1050 and may communicate with other devices connected to the port 1060 as well as with the display 1010, the sensor 1020, the memory 1030 and the communication transceiver 1040, etc., via a bus 1070.

The memory 1030 may be a non-transitory computer readable storage medium storing data for the operation of the electronic device 1000 and/or multimedia data. The memory 1030 may include a volatile memory such as a random access memory (RAM) or a nonvolatile memory such as a flash memory, etc. The memory 1030 may also include at least one of a solid state drive (SSD), a hard disk drive (HDD), and an optical drive (ODD), etc. as a storage device. In the at least one example embodiment illustrated in FIG. 27, the memory 1030 may include a memory device according to various example embodiments described above with reference to FIGS. 1 through 26.

As set forth above, according to at least one example embodiment, a memory device includes bit lines extending in a first direction and word lines extending in a second direction, intersecting the first direction, and memory cells may be between the bit lines and the word lines. Bit lines may be connected to circuit devices through bit line contacts in a bit line contact region, and memory cells may be further above the bit lines in the bit line contact region. Therefore, the degree of integration of memory device may be increased, the physical size of the memory device may be decreased, the complexity of memory device may be reduced, thereby increasing the manufacturing yield and/or reducing the manufacturing costs of the memory device, and/or additionally memory cells may be utilized for redundancy and/or testing purposes, thereby improving reliability of a memory device, etc.

While various example embodiments have been illustrated and described above, it will be apparent to those skilled in the art that various modifications and variations could be made without departing from the scope of the example embodiments of the present inventive concepts as defined by the appended claims.

What is claimed is:

1. A memory device comprising:
   a plurality of bit lines extending in a first direction;
   a plurality of lower memory cells below the plurality of bit lines, the plurality of lower memory cells connected to the plurality of bit lines;
   a plurality of upper memory cells above the plurality of bit lines, the plurality of upper memory cells connected to the plurality of bit lines; and
   a plurality of cell array regions and a plurality of bit line contact regions alternately arranged in the first direction,
   the plurality of cell array regions including the plurality of upper memory cells and the plurality of lower memory cells, and
   only the upper memory cells are arranged in at least one of the plurality of bit line contact regions.

2. The memory device of claim 1, wherein
   the plurality of bit lines are connected to a plurality of bit line contacts included in the plurality of bit line contact regions; and
   the plurality of bit line contacts are connected to a plurality of circuit devices, the plurality of circuit devices arranged below the lower memory cells in the plurality of cell array regions.

3. The memory device of claim 1, wherein the plurality of bit line contact regions have a physical area smaller than a physical area of the cell array regions.

4. The memory device of claim 3, wherein at least two bit line contact regions of the plurality of bit line contact regions have different physical areas from each other.

5. The memory device of claim 3, wherein
   the plurality of bit line contact regions comprise a first bit line contact region and a second bit line contact region arranged in different positions in the first direction; and
   the first bit line contact region and the second bit line contact region have different widths from each other in the first direction.

6. The memory device of claim 5, wherein
   the first bit line contact region is closer to a center of the plurality of bit lines in the first direction than the second bit line contact region; and
   the second bit line contact region has a width which is less than a width of the first bit line contact region, in the first direction.

7. The memory device of claim 1, wherein the plurality of upper memory cells included in the plurality of bit line contact regions are test memory cells or redundancy memory cells.

8. The memory device of claim 1, wherein the number of the plurality of upper memory cells is greater than the number of the plurality of lower memory cells.

9. The memory device of claim 1, further comprising:
   a plurality of lower word lines extending in a second direction, the second direction intersecting the first direction, the plurality of lower word lines below the plurality of lower memory cells and configured to be connected to the plurality of lower memory cells;
   a plurality of upper word lines extending in the second direction and above the plurality of upper memory cells, the plurality of upper word lines configured to be connected to the plurality of upper memory cells; and
   a plurality of word line contact regions between the plurality of lower word lines in the second direction,
   the plurality of lower word lines are connected to a plurality of lower word line contacts below the plurality of cell array regions, and the plurality of upper word lines are connected to a plurality of upper word line contacts included in the plurality of word line contact regions.

10. The memory device of claim 9, wherein
    the plurality of upper word line contacts are connected to an upper word line decoder; and
    the upper word line decoder is adjacent to one of the word line contact regions in the second direction.

11. The memory device of claim 10, wherein
    the plurality of lower word line contacts are connected to a lower word line decoder; and
    the upper word line decoder is arranged between one of the word line contact regions and the lower word line decoder, in the second direction.

12. The memory device of claim 11, further comprising:
    a plurality of bit line contacts connected to a bit line decoder; and
    at least one boundary of the bit line decoder is adjacent to one of the plurality of bit line contact regions in the first direction.

13. A memory device comprising:
    a first layer of bitlines, the first layer of bit lines including a plurality of bit lines located at different heights from an upper surface of a substrate, the plurality of bit lines extending in a first direction, parallel to the upper surface of the substrate;
    a first and second layer of word lines, the first and second layer of word lines each including a plurality of word lines located at a height different from the heights of the plurality of bit lines in a direction perpendicular to the upper surface of the substrate, the plurality of word lines extending in a second direction, the second direction intersecting the first direction; and
    a plurality of memory layers each including a plurality of memory cells arranged between the plurality of bit lines and the plurality of word lines adjacent to each other in the direction perpendicular to the upper surface of the substrate, the plurality of memory layers each connected to the first layer of bit lines and one of the first or second layer of word lines, and
    an uppermost memory layer of the plurality of memory layers includes a number of memory cells greater than a number of memory cells included in each of remaining memory layers among the plurality of memory layers.

14. The memory device of claim 13, wherein the plurality of bit lines are connected to a plurality of bit line contacts included in a plurality of bit line contact regions, the plurality of bit line contact regions located between the memory cells in the first direction.

15. The memory device of claim 14, wherein a pair of bit lines of the plurality of bit lines are located at different heights in the direction perpendicular to the upper surface of the substrate, are located in the same position in the second direction, and are commonly connected to one of the plurality of bit line contacts.

16. A memory device comprising:
a substrate including a plurality of unit areas;
a layer of bit lines, the layer of bit lines including a plurality of bit lines extending in a first direction, the first direction parallel to an upper surface of the substrate;
a plurality of lower word lines between the plurality of bit lines and the upper surface of the substrate, the plurality of lower word lines extending in a second direction, the second direction parallel to the upper surface of the substrate and intersecting the first direction;
a plurality of upper word lines extending in the second direction, the plurality of upper word lines above the plurality of bit lines;
a plurality of word line contact regions including a plurality of upper word line contacts connected to the plurality of upper word lines, the plurality of word line contact regions between the plurality of unit areas;
a first layer of memory cells including a first plurality of memory cells between the layer of bit lines and the plurality of lower word lines;
a second layer of memory cells including a second plurality of memory cells between the layer of bit lines and the plurality of upper word lines; and
the number of the plurality of upper word lines is greater than the number of the plurality of lower word lines.

17. The memory device of claim 16, wherein the plurality of word line contact regions extend in the first direction, the plurality of word line contact regions are located between a pair of unit areas adjacent to each other in the second direction among the plurality of unit areas.

18. The memory device of claim 16, wherein each of the unit areas comprises:
a plurality of bit line contacts connected to the plurality of bit lines;
a plurality of bit line contact regions extending in the second direction; and
only one of either the plurality of upper word lines or the plurality lower word lines are arranged in the plurality of bit line contact regions.

19. The memory device of claim 18, wherein the plurality of bit line contacts are between the plurality of memory cells in the first direction.

20. The memory device of claim 18, wherein the plurality of bit line contact regions includes a first bit line contact region closest to a boundary between two unit areas adjacent to each other in the first direction, the first bit line contact region having a width less than a width of each of the other bit line contact regions of the plurality of bit line contact regions.

* * * * *